United States Patent [19]

Cipolla et al.

[11] Patent Number: 5,113,565
[45] Date of Patent: May 19, 1992

[54] APPARATUS AND METHOD FOR INSPECTION AND ALIGNMENT OF SEMICONDUCTOR CHIPS AND CONDUCTIVE LEAD FRAMES

[75] Inventors: Thomas M. Cipolla, Junction; Paul W. Coteus; Glen W. Johnson, both of Yorktown Heights, all of N.Y.; Philip Murphy, New Fairfield, Conn.; Christopher W. Oden, Brooklyn, N.Y.

[73] Assignee: International Business Machines Corp., Armonk, N.Y.

[21] Appl. No.: 549,577

[22] Filed: Jul. 6, 1990

[51] Int. Cl.$^5$ .................. H01L 21/60; H01L 21/58
[52] U.S. Cl. .................. 29/25.01; 437/220; 228/102; 228/180.2; 228/9; 228/49.1; 29/827; 29/740; 29/833; 29/834; 382/8; 358/101; 358/107
[58] Field of Search ............ 358/101, 107; 382/8; 228/102, 103, 180.2, 6.2, 7, 9, 49.1; 437/220, 206, 8; 29/827, 740, 833, 834, 25.01

[56] References Cited

U.S. PATENT DOCUMENTS

| | | | |
|---|---|---|---|
| 4,203,132 | 5/1980 | Schmitt et al. | 358/101 |
| 4,236,306 | 12/1980 | Hug et al. | 29/827 |
| 4,352,125 | 9/1982 | Guth | 358/101 |
| 4,450,579 | 5/1984 | Nakashima et al. | 382/8 |
| 4,481,664 | 11/1984 | Linger et al. | 382/8 |
| 4,500,202 | 2/1985 | Smyth | 356/237 |
| 4,507,605 | 3/1985 | Geisel | 324/73 |
| 4,516,673 | 5/1985 | Kashihara et al. | 198/341 |
| 4,555,798 | 11/1985 | Broadbent, Jr. et al. | 382/8 |
| 4,578,810 | 3/1986 | MacFarlane et al. | 382/8 |
| 4,604,648 | 8/1986 | Kley | 358/101 |
| 4,606,717 | 8/1986 | Takahashi et al. | 29/740 |
| 4,675,993 | 6/1987 | Harada | 29/740 |
| 4,677,258 | 6/1987 | Kawashima et al. | 178/18 |
| 4,683,644 | 8/1987 | Tange et al. | 437/7 |
| 4,688,939 | 8/1987 | Ray | 356/237 |
| 4,738,025 | 4/1988 | Arnold | 29/834 |
| 4,759,073 | 7/1988 | Shah et al. | 382/88 |
| 4,803,358 | 2/1989 | Kato et al. | 250/310 |
| 4,811,410 | 3/1989 | Amir et al. | 382/8 |
| 4,813,588 | 3/1989 | Srivastava et al. | 228/103 |
| 4,843,695 | 7/1989 | Doe et al. | 29/827 |
| 4,851,902 | 7/1989 | Tezuka et al. | 358/101 |

FOREIGN PATENT DOCUMENTS

WO85/02088 5/1985 Fed. Rep. of Germany.

OTHER PUBLICATIONS

Cipolla et al., "Illuminator For Integrated Circuits Having Raised Features", IBM Technical Disclosure Bulletin, vol. 32, No 1. 11, Apr. 1990, pp. 459-460.

D.J. Hutson, "Segmentation Technique For Automatic Visual Inspection Using A Color Camera", IBM Technical Disclosure Bulletin, vol. 30, No. 3, Aug. 1987, pp. 1197-1199.

Primary Examiner—Olik Chaudhuri
Assistant Examiner—David E. Graybill
Attorney, Agent, or Firm—Perman & Green

[57] ABSTRACT

A method is described for aligning a contact pattern on an electronic device held by a first movable support, with a bond site pattern on a lead frame held by a second movable support. The method includes the steps of: (a) creating and storing models of a chip's contact pattern and a lead frame's bond site pattern; (b) imaging the electronic device and lead frame; (c) determining the position of contacts on said electronic device and reorienting the contact pattern model to a best fit with the imaged contact position; (d) determining the position of each bond site on the imaged lead frame and reorienting the bond site model to a best fit with the imaged bond site position; (e) determining positional differences between the reoriented lead frame and contact pattern models; and (f) generating signals to reorient the first and second movable supports to minimize the positional differences when they are moved into a bonding positon. A machine is described for performing the above method wherein each of three main movable elements of the machine is assigned a dimensional axis in which its travel is non-adjustable, so that other movable elements can be calibrated thereagainst.

22 Claims, 26 Drawing Sheets

LEAD FRAME ROUTINE

CONVOLUTION SUB-ROUTINE

LEAD FRAME ROUTINE (CONT'D)

LEAD FRAME ROUTINE (CONT'D)

LEAD FRAME FINE POSITIONING

CHIP INSPECTION / POSITION ROUTINE

CHIP INSPECTION/POSITION ROUTINE

CHIP INSPECTION/POSITION ROUTINE

CHIP INSPECTION / POSITION ROUTINE

CHIP INSPECTION / POSITION ROUTINE

FIT OF MEASURED VALLEY POSITIONS

FIT OF MEASURED VALLEY POSITIONS

CHIP BONDING

APPARATUS AND METHOD FOR INSPECTION AND ALIGNMENT OF SEMICONDUCTOR CHIPS AND CONDUCTIVE LEAD FRAMES

FIELD OF THE INVENTION

This invention relates to a method and apparatus for placing semiconductor devices on lead frames and, more particularly, to a method and system which enables fast and highly accurate chip placement and bonding on a TAB lead frame.

BACKGROUND OF THE INVENTION

In tape automated bonding (TAB) microelectronic packaging, a set of beam leads (a "lead frame") electrically interconnects a semiconductor chip to a circuit-board substrate. The beam leads are supported on a polymer substrate called a TAB tape, and each frame of the TAB tape contains a new lead frame. Each lead frame contains an inner lead bond area where individual beam leads are aligned with a chip's contact location, and an outer lead bond area for electrically interconnecting the chip to a circuit board substrate. To make the desired interconnections between a chip and lead frame, a heated bonding head (thermode) forces the individual beam leads in the inner lead bond area against the chip's contacts to achieve a thermal, compression-bond.

TAB technology is moving in a direction of more leads and smaller spacings. Today, TAB lead sizes are on the order of two thousandth's of an inch widths on four thousandths centers. To assure proper registration, the semiconductor industry has been forced to use optical alignment techniques when placing chips on lead frames.

The art is replete with examples of automated article inspection systems and chip placement machines. In U.S. Pat. No. 4,759,073 to Shah et al, a wire bonder is disclosed wherein a chip is rotated four times, with each side being bonded sequentially. After each rotation, a signature area on the chip is determined and the chip is repositioned with respect to the signature area. In U.S. Pat. No. 4,738,025 to Arnold, an automated chip positioning system is described wherein both a chip and circuit board are visualized and viewing heads are calibrated to enable a positioning member to position the chip on the circuit board at a correct position and orientation.

While the viewing systems of Shah et al. and Arnold are relatively unsophisticated, a more elegant viewing system is described in U.S. Pat. No. 4,851,902 to Tesuka et al. This system is employed as a visual inspection unit to determine plating quality on a unit being inspected. An image is captured from reflected light off an IC frame. The image is used to correct errors in position between a reference stored image and itself. A significant problem exists with respect to reflected light vision systems in that they are highly susceptible to changes in reflectivity of the surface being examined.

A similar viewing system is described in U.S. Pat. No. 4,688,939 to Ray, but this system is directed to the inspection of solder bumps on a chip. A ring-light is placed above and about the chip so that its light is directed at an angle towards all sides of the chip, with the solder bumps thereby reflecting the light upwardly, while the remaining portions of the chip diffuse the light elsewhere. Here again, light reflectivity is a significant factor in differentiating the light reflected from the solder bumps from light reflected by the remaining surface areas of the chip.

Other imaging systems exhibit one or more of the following drawbacks: the resolution capability of the system is limited by the pixel (pel) size in the imaging electronics; the stored image against which a comparison is made is derived from the scanning of the "standard" device or substrate; the system examines the unit under test from a global point of view and is unable to specify with particularity, the precise details of an image which are inconsistent with the stored reference image; or the vision system is dependent upon analysis of binary image pels instead of using full grey-scale information. Prior art which exhibits one or more of those drawbacks is as follows: U.S. Pat. Nos. 4,481,664 to Linger et al., 4,500,202 to Smith; 4,555,798 to Broadbent, Jr.; 4,578,810 to Macfarlane et al.; 4,450,579 to Nakashima et al.; and 4,811,410 to Amir et al.

In order to implement a sophisticated chip/TAB lead frame imaging system, a chip placement/TAB tape movement machine must have many degrees of freedom to enable accurate positioning and bonding of chips to the lead frames. The design of such a machine requires that its movable elements be referenced to a datum to assure precise and reproducible movements. While the prior art describes the use of built-in calibration mechanisms, the weakness in such machines is that the datum surfaces are separate from other moving elements. Thus, if for any reason the calibration data is "off", the entire system becomes potentially inoperative. In a system with a plurality of moving elements, it is preferred to interrelate the reference datums among the elements, rather than with some independent, fixed structure.

Prior art references indicating various aspects of device imaging systems can be found in U.S. Pat. Nos. 4,236,306 to Hug et al; 4,507,605 to Gersel; 4,516,673 to Kashihara et al.; 4,606,117 to Takahashi et al.; 4,675,993 to Haroda; 4,677,258 to Kawashima et al.; 4,683,644 to Tange et al.; 4,803,358 to Kato et al; 4,813,588 to Srivastava et al.; 4,843,695 to Doe et al.; and in IBM Technical Disclosure Bulletin, Vol. 30, No. 3, August 1987, pp. 1197-1199 (Hutson) and Vol. 32, No. 11, April 1990, pp. 459,460 (Cipolla et al.).

Accordingly, it is an object of this invention to provide an improved method for aligning a contact pattern on a semiconductor chip with a TAB lead frame.

It is another object of this invention to provide an improved chip/TAB lead frame alignment method which is not limited in its accuracy by the pel resolution of an imaging system (i.e.: discrete size of individual sensors in an imaging system).

It is still another object of this invention to provide an improved method for aligning a chip with a TAB lead frame, wherein an imaging system used therewith is not dependent upon the reflectivity of the elements being joined.

It is yet another object of this invention to provide an improved chip placement machine whose movable elements have a plurality of freedoms of motion, with each movable element having a datum axis of motion against which the other elements are referenced.

SUMMARY OF THE INVENTION

A method is described for aligning a contact pattern on an electronic device held by a first movable support, with a bond site pattern on a lead frame held by a second movable support. The method includes the steps of: (a) creating and storing models of a chip's contact pattern and a lead frame's bond site pattern; (b) imaging the electronic device and lead frame; (c) determining the position of contacts on said electronic device and reorienting the contact pattern model to a best fit with the imaged contact position; (d) determining the position of each bond site on the imaged lead frame and reorienting the bond site model to a best fit with the imaged bond site position; (e) determining positional differences between the reoriented lead frame and contact pattern models; and (f) generating signals to reorient the first and second movable supports to minimize the positional differences as they are moved into a bonding position. A machine is described for performing the above method wherein each of three main movable elements of the machine is assigned a dimensional axis in which its travel is non-adjustable, so that other movable elements can be calibrated thereagainst.

DETAILED DESCRIPTION OF THE INVENTION

Figure 1:
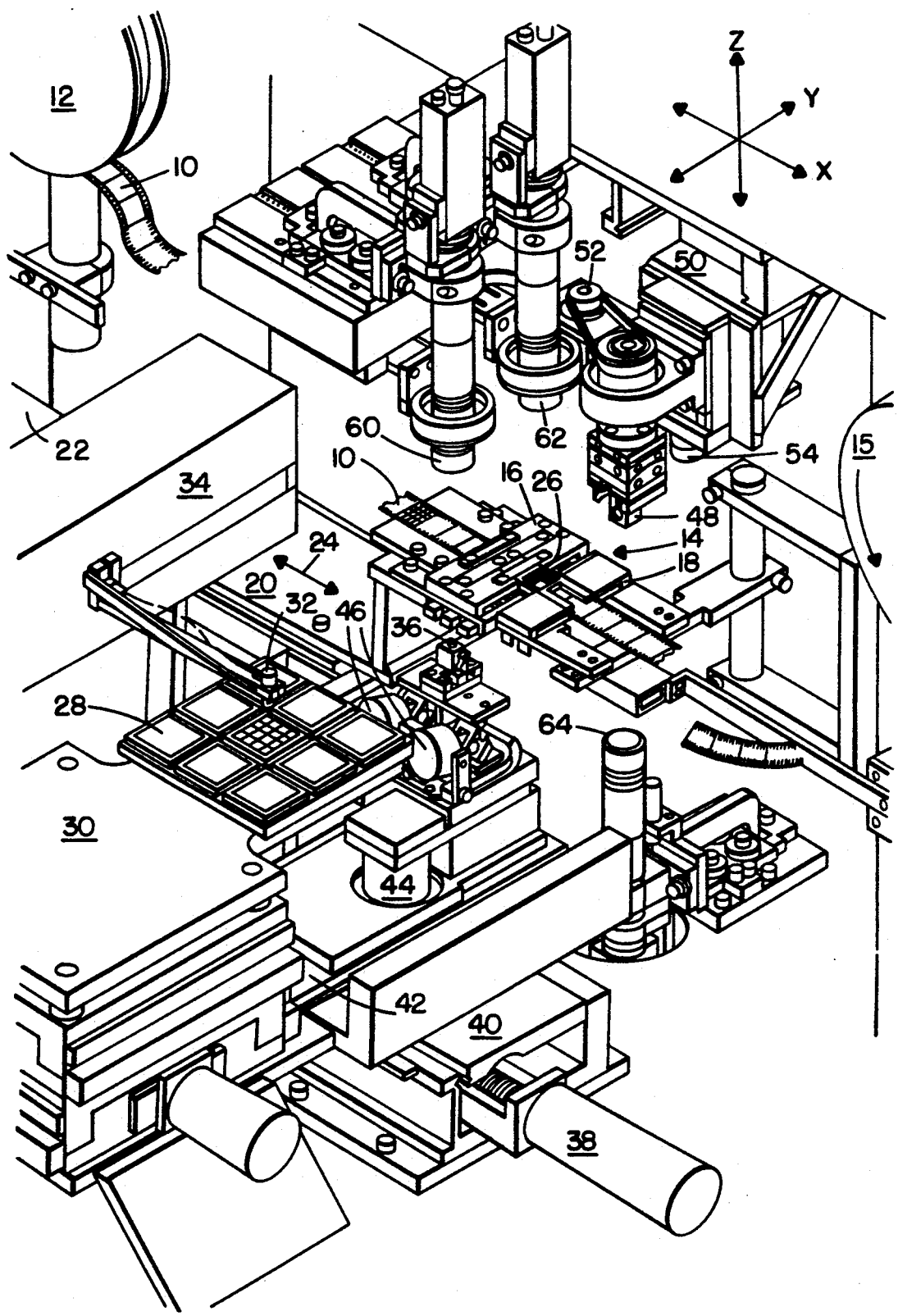
FIG. 1 is a partial perspective view of a chip placement and bonding machine which incorporates the invention.

Referring now to FIG. 1, TAB tape 10 is fed from a feed reel 12 through a hitch feed mechanism 14 to a take up reel 15. The details of hitch feed mechanism 14 are described in copending U.S. patent application Ser. No. 07/546,496, entitled "Tape Automated Bonding Feeder" to Cipolla et al., filed on even date herewith.

In brief, hitch feed mechanism 14 comprises a movable gripper assembly 16 and a fixed jaw assembly 18. Movable gripper assembly 16 is mounted on a platform which is in turn mounted on a slider plate 20 that is connected to a bidirectional rotary motor 22 (shown partially). The action of motor 22 upon slider plate 20 causes it to move, reciprocally, along the directions indicated by arrows 24. Movable gripper assembly 16 is provided with a window 26 in which a leadframe on TAB tape 10 can be imaged and where a chip can be bonded.

During hitch feeding, motor 22 moves slider 20 to the left at the same time as grippers in movable gripper assembly 16 are opened. This action causes movable gripper assembly 16 to increment to the left by one lead frame. Simultaneously, fixed jaw assembly 12 is closed and prevents the movement of TAB tape 10, when movable gripper assembly 16 moves to the left. At the left-most limit of movement of slider plate 20, grippers in movable gripper assembly 16 close upon the edges of TAB tape 10, and the jaws in fixed jaw assembly 18 are opened. At this point, a new lead frame is positioned in window 26, and it is then incremented to the right by movement of slider plate 20 into the bonding position shown in FIG. 1.

As will be understood from description below, at the end of the right-ward movement of movable gripper assembly 16, a lead frame in window 26 is imaged. If the lead frame is determined to be out of position, a signal is provided to motor 22 to cause a vernier adjustment of slider plate 20 (and TAB tape 10) along the X-axis direction of travel of TAB tape 10 (see axes of travel at upper right of FIG. 1). Thus, the position of TAB tape 10 is both grossly and finely adjustable along the X axis. As the position of TAB tape 10 is confined along the Y axis, there is no provision for position adjustment along that axis.

As above stated, as each lead frame on TAB tape 10 is incremented into window 26 by hitch feed mechanism 14, a chip (or chips) may be emplaced on the lead frame and bonded thereto. Those chips are accessed from a waffle holder 28 which stores a plurality of prepositioned semiconductor chips. A plurality of waffle holders 28 are mounted on a movable table 30 which enables each waffle holder 28 to be properly positioned beneath a vacuum head 32.

When a chip is in place on vacuum head 32, it is incremented by a mechanism 34 and moved to place the chip over a vacuum thermode 36. When vacuum head 32 is properly positioned over vacuum thermode 36, the chip is transferred to thermode 36 by turning on its vacuum supply and cutting off the vacuum supply to head 32. A nitrogen gas jet may be provided at this point to remove any debris from the surface of the chip (not shown).

When a chip is placed on vacuum thermode 36, it is oriented so that its contact pattern is face up. Thus, when vacuum thermode 36 is subsequently moved into a bonding position beneath window 26, a chip on its uppermost surface is adapted to be bonded to a lead frame positioned in window 26.

Vacuum thermode 36 is provided with several motor drive assemblies for control of its movement along a plurality of axes. Thermode 36 is adjustably movable along both the X and Y axes by a pair of orthogonally positioned rotary drive motors 38 (only one is shown). The X axis rotary drive motor 38 connects to a slider plate 40 (on which thermode 36 is mounted). Motor 38 is thus able to precisely position thermode 36 along the X axis in accordance with control signals fed to it from a control unit. Thermode 36 can similarly be positioned along the Y axis by another motor 38 connected to slider plate 42. A third motor 44 controls the rotary position of thermode 36 about the Z axis. A pair of pneumatic actuators 46 raise and lower thermode 36 along the Z axis, but do so only between fixed up and down positions. Thus, while thermode 36 is adjustably translatable along the X and Y axes and is adjustably rotatable about the Z axis, its translation along the Z axis is between fixed up and down positions which are not adjustable in real time. The fixed up position of thermode 36 assures that any chip positioned thereon will have its contact pattern invariably placed in a known position on the Z axis beneath window 26.

In the position shown in FIG. 1, thermode 36 is to the left of hitch feed mechanism 14 and in its uppermost Z axis travel position. It is at this position where it receives a chip from vacuum head 32. Subsequently, it is withdrawn to its down Z axis position, translated to the right along the Y axis to a viewing position and then to a position directly beneath window 26 where it is translated upwardly to its up Z axis position. Intermediate the time between its position as shown in FIG. 1 and its subsequent position beneath window 26, motors 38 and 44 adjust the position of thermode 36 to assure a match between the chip's contact pattern and a lead frame in window 26.

A second thermode 48 is positioned to the right of hitch feed mechanism 14 and is shown positioned above the upper surface thereof. Thermode 48 can act as either a heated anvil during the bonding of a chip to a lead frame, or as an additional vacuum thermode for carrying a second semiconductor chip to the upper surface of TAB tape 10 for bonding. In the latter case, a further waffle holder and vacuum chip transport mechanism are provided (not shown in FIG. 1). The details of construction of thermode 40 can be found in U.S. Pat. No. 4,875,614 to Cipolla et al., assigned to the same Assignee as this application. The teachings of that patent are incorporated herein by reference.

Thermode 48 is constructed so as to be freely movable in the pitch, yaw, and roll dimensions, so that it can reliably contact a lead bond frame, to the underside of which, a chip has been positioned for bonding. Additionally, thermode 48 is adjustably movable along the Y axis by virtue of its attachment to a slider plate 50, and is further adjustably rotatable about the Z axis due to its attachment to a motor driven spindle 52. Thermode 48 is positionally fixed along the X axis and its X position controls the X placement of both hitch feed mechanism 14 and lower vacuum thermode 36.

Vacuum thermode 48 has a plurality of internal springs (not shown) and is movable along the Z axis by a programmable motor 54. By adjusting the amount of travel of thermode 38 along the Z axis, its internal springs exert pressure on a lead bond frame in window 26 to provide optimum thermo-compression bonding between the frame and an underlying chip contact pattern.

Figure 3:
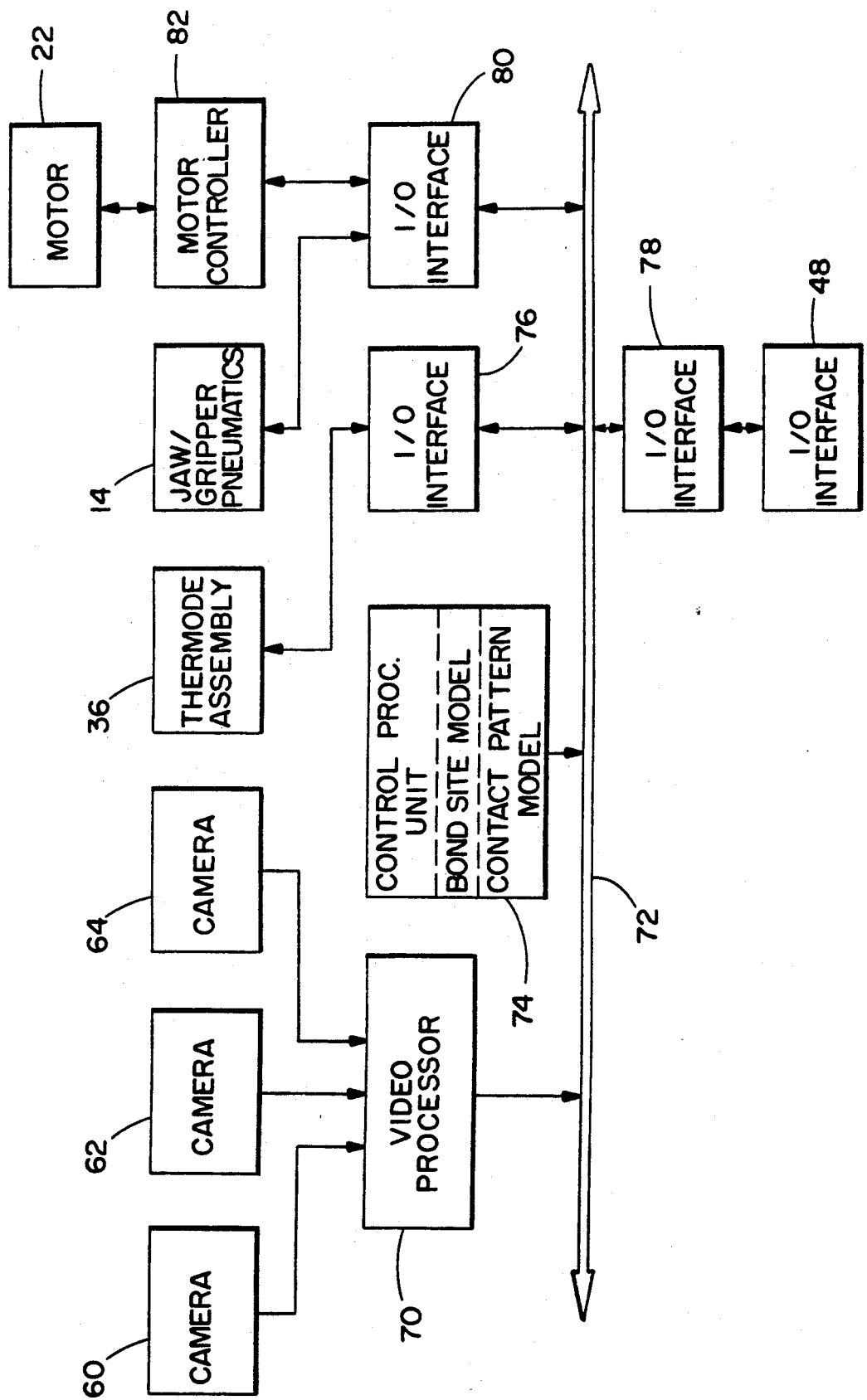
FIG. 3 is a high level block diagram showing the control system for the invention.

Three Video cameras 60, 62, and 64 are respectively focused on thermode 36 (when it is in the viewing position), window 26, and thermode 48. Each of cameras 60, 62, and 64 provides an image input to a control system (shown in FIG. 3) which, in response thereto, operates the machine. As shown in FIG. 3, cameras 60, 62, and 64 feed into a video processor 70 whose output is connected via bus 72, to a central processing unit (CPU) 74. CPU 74 stores both a bond site model and a contact pattern model. The bond site model is a mathematical description of each beam lead bond site and its relation to all other bond sites. Similarly the contact pattern model is a precise description of each contact and its relationship to all other contacts on a chip. The comparison of these models to imaged bond sites and contact patterns, and the adjustment of the models to a best fit with the imaged sites and patterns enables precise control of the invention.

Outputs from CPU 74 are fed to control various components of the invention. One output is fed via I/0 interface 76 to control the positioning of thermode 36 and its assembly. Another output from CPU 74 is fed via I/0 interface 78, to control the position of thermode 48 and its assembly. Finally, a third output from CPU 74 is fed via I/0 interface 80 to control both the pneumatics which operate the jaws and grippers on hitch feeder assembly 14 and to further control, via a motor controller 82, motor 22 which increments TAB tape 10.

Figure 2:
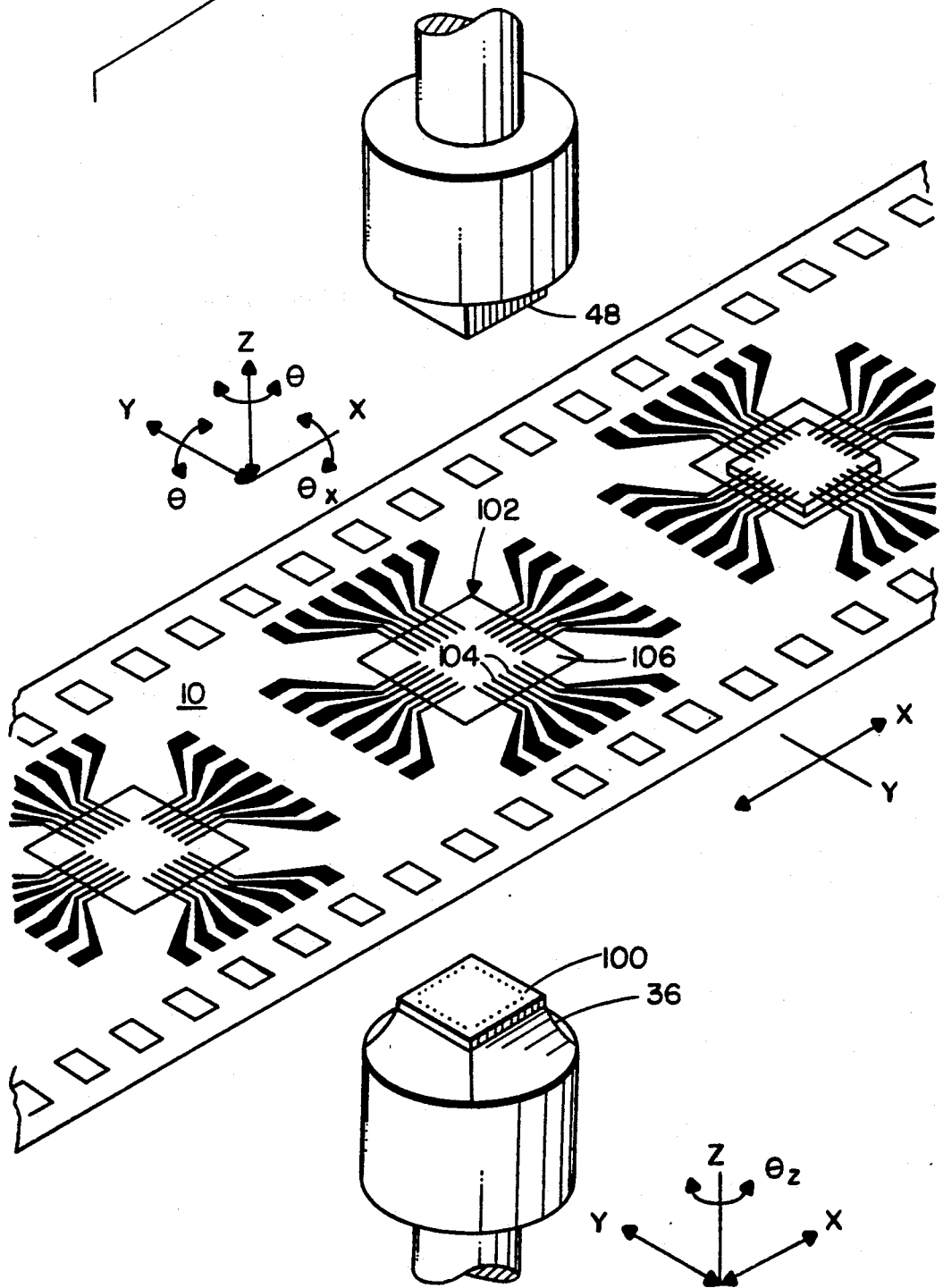
FIG. 2 is a schematic perspective view of the major movable portion of the chip placement and bonding machine.

In FIG. 2 a schematic illustrates the relative positions of TAB tape 10 and thermodes 36 and 48. A semiconductor chip 100 is shown in place on thermode 36 in a contacts-up orientation. It is the contact pattern on the face of chip 100 that is described by the contact pattern model in CPU 74. More specifically, it is the contact pattern model which precisely describes the relative positioning of each contact on the surface of chip 100. However, due to manufacturing anomalies, the contact pattern on the face of chip 100 may, at times, not match that of the contact pattern model and furthermore, the position of chip 100 on thermode 36 may be skewed so that it is positionally offset (both translated and rotated) from the orientation of the model. These offsets must be corrected prior to any bonding action. Furthermore, if a chip offset is found to be too great, a contact is found to be missing from the pattern, or a single contact is mispositioned with respect to its expected position, the chip must be rejected and replaced by another one.

The X, Y, and Z axes shown to the right of thermode 36 indicate that its position is adjustable along and X and Y axis and rotatable about the Z axis, but it is not adjustably movable along the Z axis nor rotatable about the X and Y axes. As will be remembered, thermode 36 is movable between up and down positions, with those positions being fixed and non-adjustable. In the same manner, thermode 48 is adjustable along the Y and Z axes but not along the X axis.

Shown on TAB tape 10 are a plurality of lead frames 102, each of which comprises a plurality of beam leads 104 that extend over an opening 106. Each beam lead 104 is provided with a bond site thereon to which a contact on chip 100 will be adhered. The bond site model contained in CPU 74 describes the position of each of beam leads 104 and its associated bond site, and assumes the lead frame is "perfect". As is known, lead frames sometimes become bent or otherwise deformed as the result of handling or manufacturing anomalies.

The comparison of an imaged lead frame with the bond site model, enables such anomalous lead frames to be detected and sorted.

As shown by the axes to the right of TAB tape 10, it is adjustably movable in the X dimension but not in the Y dimension. Thus, it can be seen from FIG. 2 that each element of the chip placement and bonding system has a dimension in which it is non-adjustable. This enables the position controls to be distributed amongst the various elements of the system and avoids the need for duplication of adjustable position controls.

The detailed operation of the chip placement and bonding system of FIG. 1, in conjunction with the control system shown in FIG. 3, will now be described in detail. The flow diagrams shown on FIGS. 14-32 will be employed to describe the functions which occur during the operation of the system. Further, the flow diagrams of FIGS. 14-32 will be described in conjunction with FIGS. 4-13, which help in visualizing the functions that occur at various points during the operation.

Figure 14:
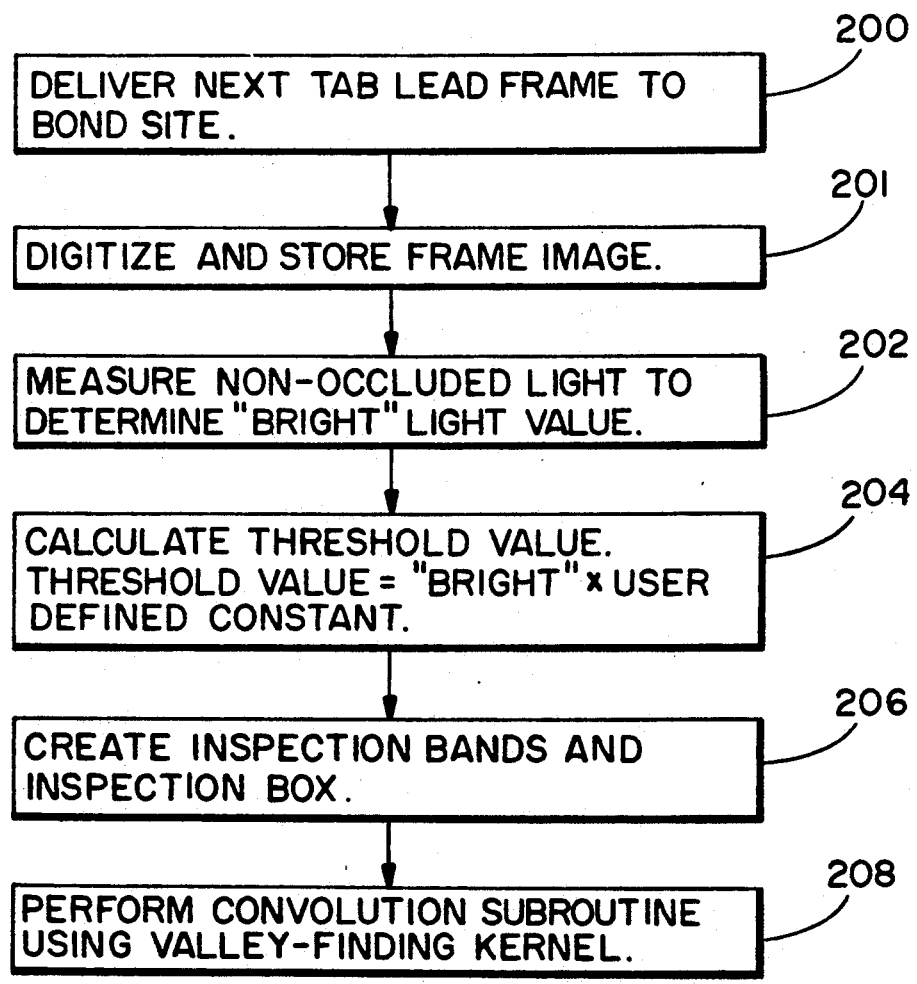
FIG. 14 is a high level flow diagram illustrating the initiation of a lead frame imaging routine.

Turning now to FIG. 14, the lead frame routine commences by delivering a next TAB lead frame to the bond site in window 26 (box 200). The lead frame is imaged by camera 62 (FIG. 1), and the resulting frame image is then digitized and stored (box 201). When the image of a lead frame is obtained, it is lighted from below so that each of the beam leads is imaged as a dark object, (due to the fact that it obscures the light from imaging camera 62). A measurement is then made of non-occluded light passing through the center of the lead frame to determine a "bright" light value (box 202). A threshold value is then calculated by multiplying the bright light value times a user defined constant (box 204). This threshold value will be used hereinafter by the algorithm in determining the position of a beam lead during scanning of the digitized image.

Figure 4:
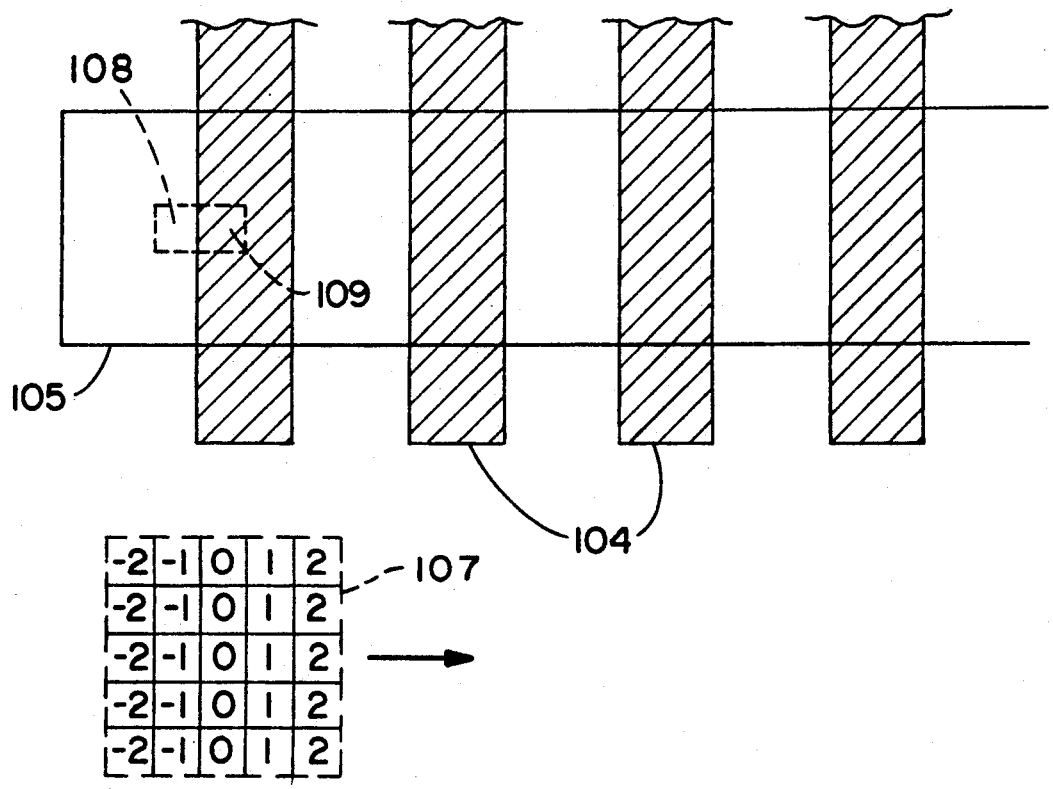
FIG. 4 is a plan view of a group of leads of a lead frame showing its relationship to an inspection band and a valley finding kernel.
Figure 5:
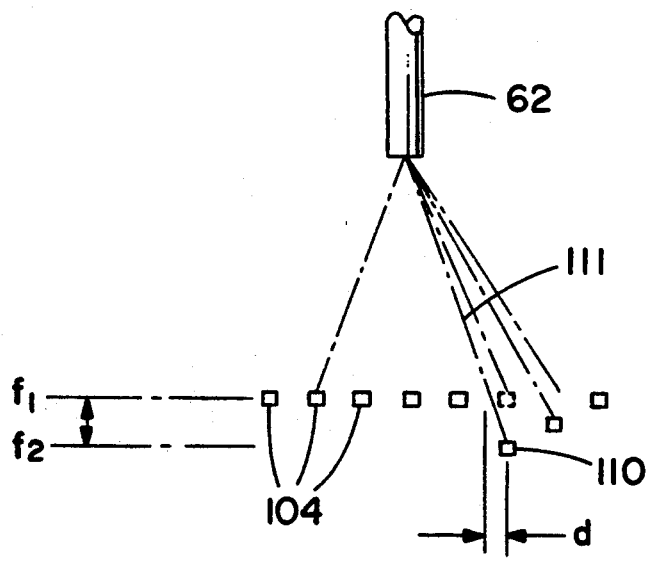
FIG. 5 is a schematic diagram showing positional errors which can occur when viewing a bent lead of a lead frame.

This operation can be better understood by referring to FIG. 4 wherein a pel representation of a plurality of beam leads 104 is illustrated. An inspection band 105 is created by the CPU and runs perpendicularly to each of beam leads 104, encompassing the regions thereon which will eventually be bonded to individual contacts on a semiconductor chip. Inspection band 105 is shown, for example, to be five pels wide and long enough to cover the entire side of the lead frame. There are identical inspection bands created for the other remaining three sides of the lead frame. Additionally, an inspection box 107 is created, and in the case shown in FIG. 4, is five pels wide by five pels long. It will be obvious to those skilled in the art that inspection bands 105 and inspection box 107 are not actually "boxes", but rather are stored data which define areas encompassing certain pels in the digitized image. Their showings in FIG. 4 are for explanatory purposes only.

Once the inspection bands and inspection box have been created (box 206), a convolution subroutine is performed using a valley-finding (i.e., intensity minimum) kernel (box 208). This kernel is shown within inspection box 107 in FIG. 4, and comprises a series of values assigned to contiguous pels. In this instance, the five contiguous pels have values of $-2$, $-1$, $0$, $+1$, and $+2$. One objective of the lead frame routine is to determine the center (i.e. bond site) of each of beam leads 104.

Figure 15:
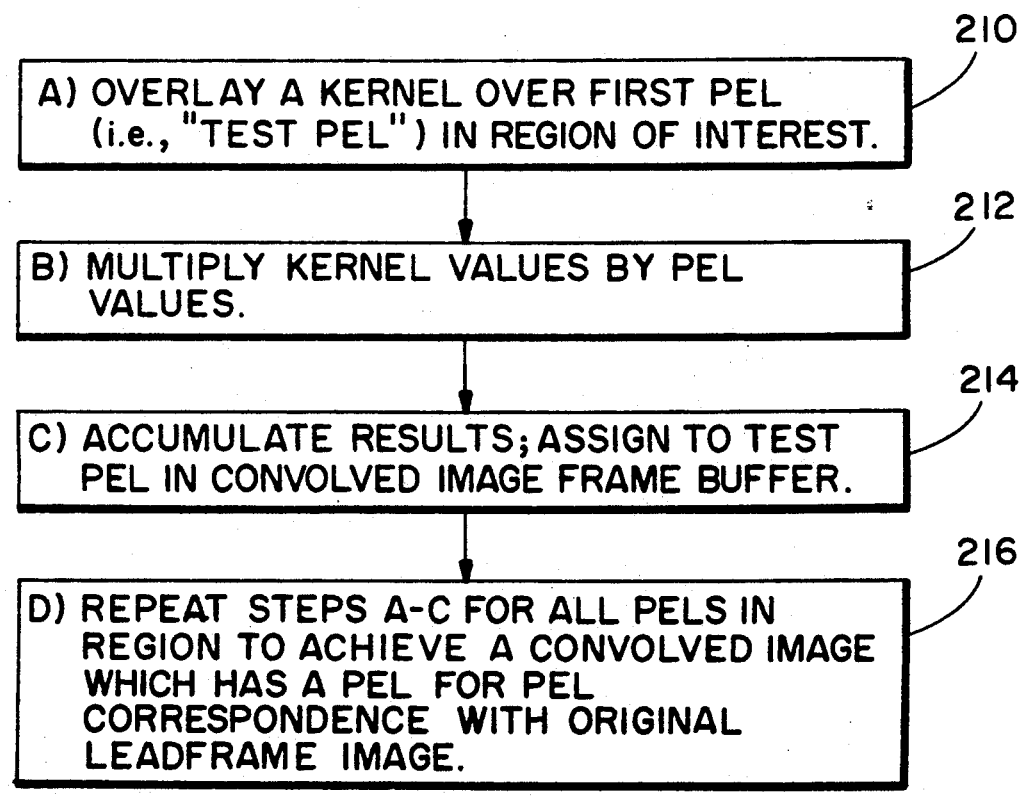
FIG. 15 is a high level flow diagram of a convolution sub-routine employed with both the lead frame and chip position/inspection imaging routines.

Turning to FIG. 15, the convolution routine commences by overlaying valley finding kernel 107 over a first pel in a region of interest (i.e., inspection band 105).

Thus, the crosshatched pel in inspection box 107 is superimposed over image pel 108. Then the gray scale value of each underlying image pel is multiplied by the value of the overlaid kernel pel (box 212) and the resulting products are added. Since there are 25 pels in the valley finding kernel 107, 25 multiplications take place, followed by the addition of all 25 products to arrive at an accumulated sum. That sum is assigned to image test pel 108 in a convolved frame buffer (not shown) (box 214).

At this point (box 216), valley finding kernel 107 is incremented to image pel 109 and the process repeated. When the inspection box reaches the end of inspection band 105, it increments back to the beginning and is moved down one line of pels and the process repeated etc. etc., until all pels in the inspection band have been convolved.

The effect of the above valley-finding action can be better understood by realizing that a value assigned to a center pel will be zero when the rate of change of light on either side of that pel is equal and opposite. For instance, if the light slope increases to the pel's right and also increases to the pel's left, the resulting values will subtract, one from the other, leaving a resultant zero value. On the other hand, a large negative value will be assigned to the center image pel when the light is falling steeply from a bright value to a dark value. Or, if the light is rising from a dark value to a much lighter value, the assigned value to the center image pel will be a large positive number. The assigned convolved values in the image frame buffer are later used to determine the center points (bond sites) on each of beam leads 104.

Figure 16:
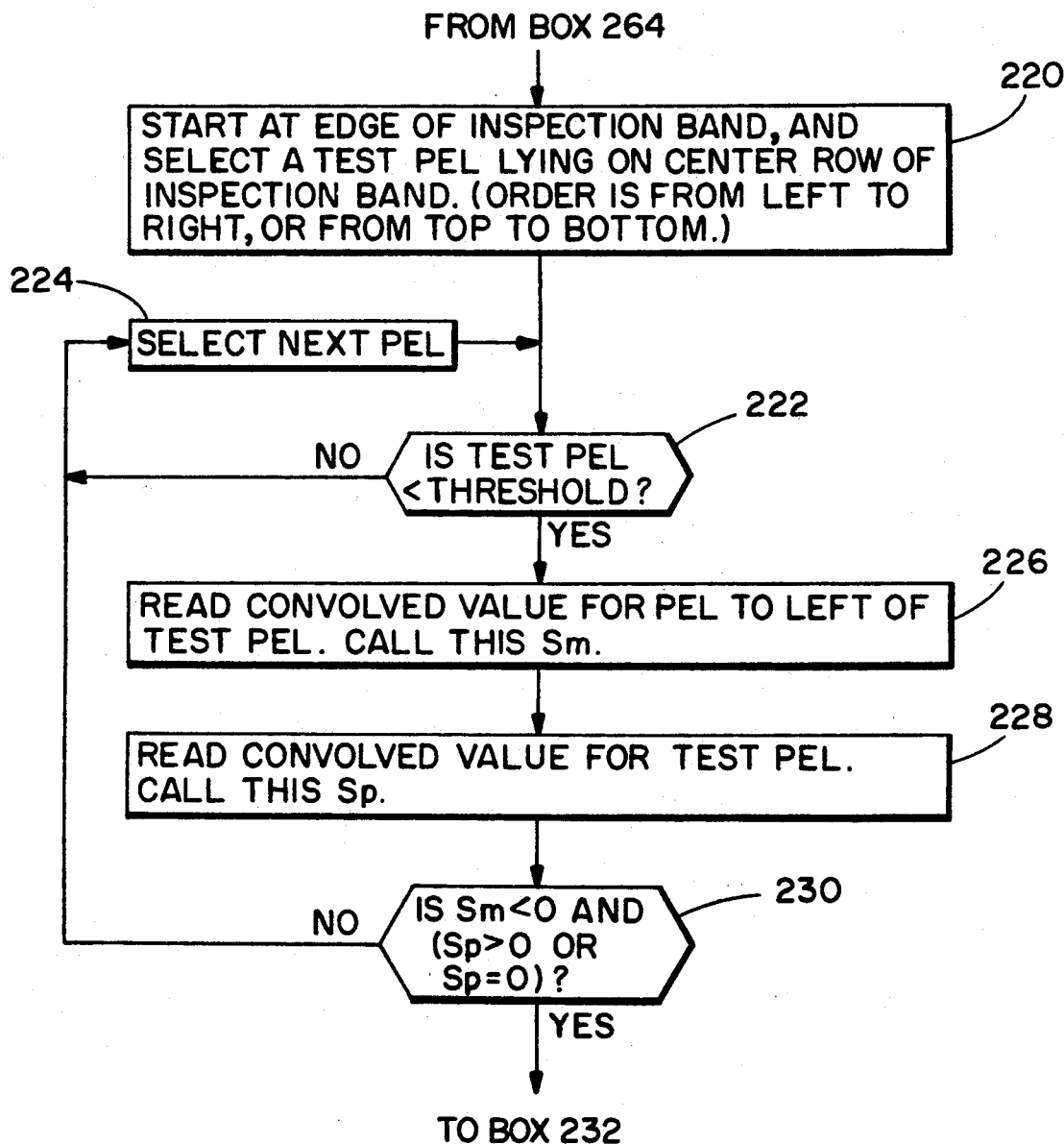
FIGS. 16–20 are further high level flow diagrams illustrating continuation of the lead frame imaging routine.

In FIG. 16, the lead frame routine continues and a test pel, e.g., 108, (FIG. 4) is selected (box 220). Initially the gray scale value of that pel is tested against the threshold value (box 222) to determine if its gray scale value is less than the threshold (indicating entry into a dark or beam lead area). If no, the next pel is selected (box 224) and the test is repeated If yes, the convolved value for a pel to the left of the test pel is read and is called Sm (box 226). The convolved value for the test pel is also read and called Sp. The tests shown in decision box 230 are then performed. First, it is determined whether the convolved value of Sm is negative ($<0$), and then whether the value of Sp is positive or equal to zero. If an AND condition is found, it indicates that there is a change in slope of light value between the pel to the left and the test pel. If no such condition is found, the next pel is selected and the tests are repeated.

Assuming an AND condition is found, the lead frame routine proceeds to box 232 where an interpolation is performed between the values Sm and Sp to find a precise location therebetween where the light slope goes to zero. This step enables a basic limitation of the imaging system to be overcome by allowing the system to achieve positional determinations which are finer than the individual pel sizes. Even though high definition imaging systems are employed, the pel sizes still present a limiting factor to the dimensional resolution which can be achieved. Thus, the convolution steps followed by the logical tests and interpolation described above, enable the imaging routine to overcome heretofore assumed pel-related system limitations.

Once a zero slope position is found, its coordinates are assigned as the center of the associated beam lead (box 234). The system then proceeds to predict the location of the center of the next beam lead in the inspection band by using the bond site model and an average of the last N predicted vs. actual lead centers found (assuming that N lead centers have been found) (box 236). At this point, the above-described test, followed by convolved value comparisons is repeated in boxes 240, 244, 246, and 248. If (as shown in box 242) a number of pels are selected and none exhibits a gray scale value less than the threshold value, then it is assumed that a beam lead is missing, and the procedure aborts after five test pels have been tested. At this point, the procedure causes a new TAB lead frame to be incremented into the bond site, the assumption being that the lead frame bond presently in the bond site is damaged. If there are a number of sequential failures, the operator is notified to take remedial action.

Figure 17:
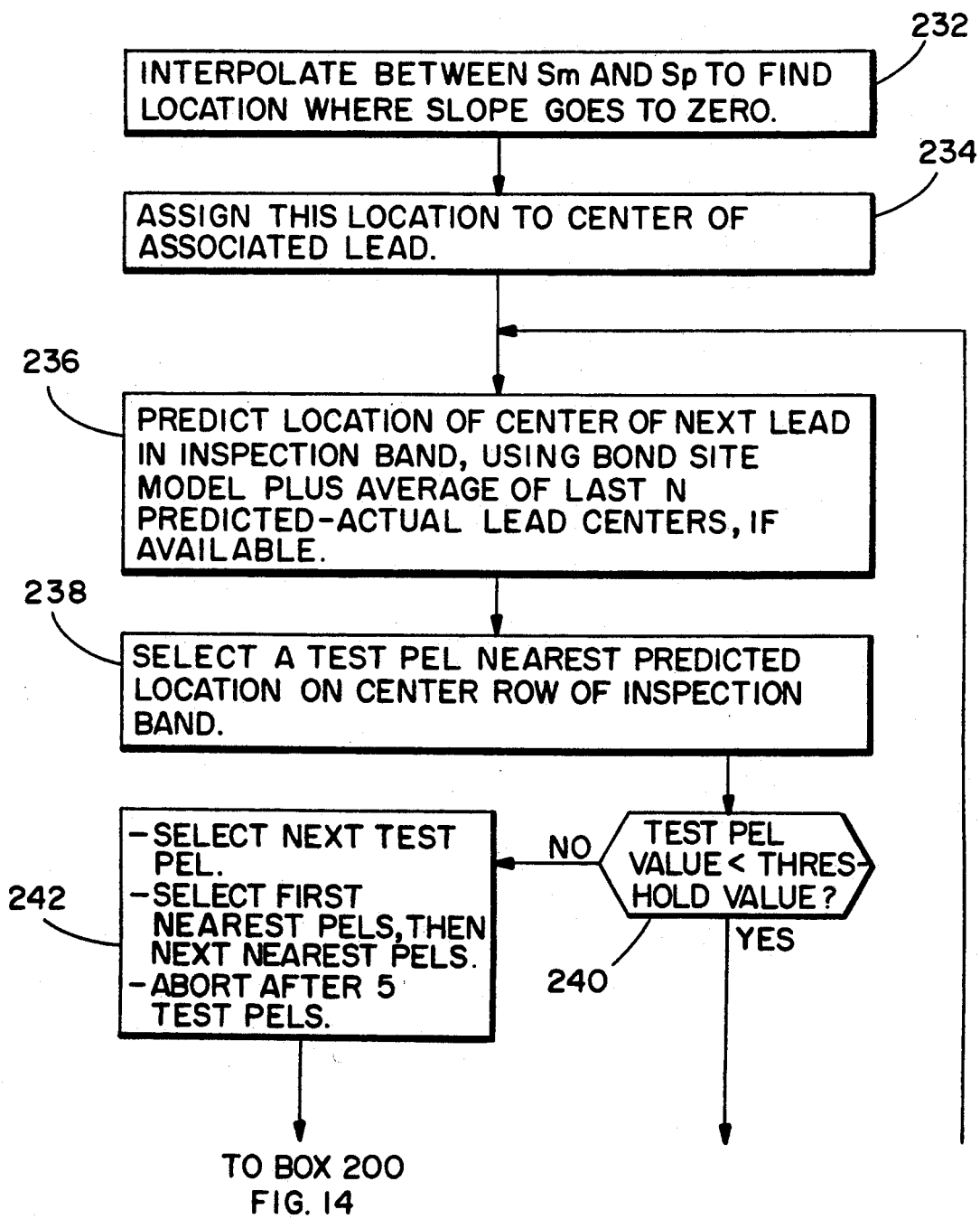
Figure 18:
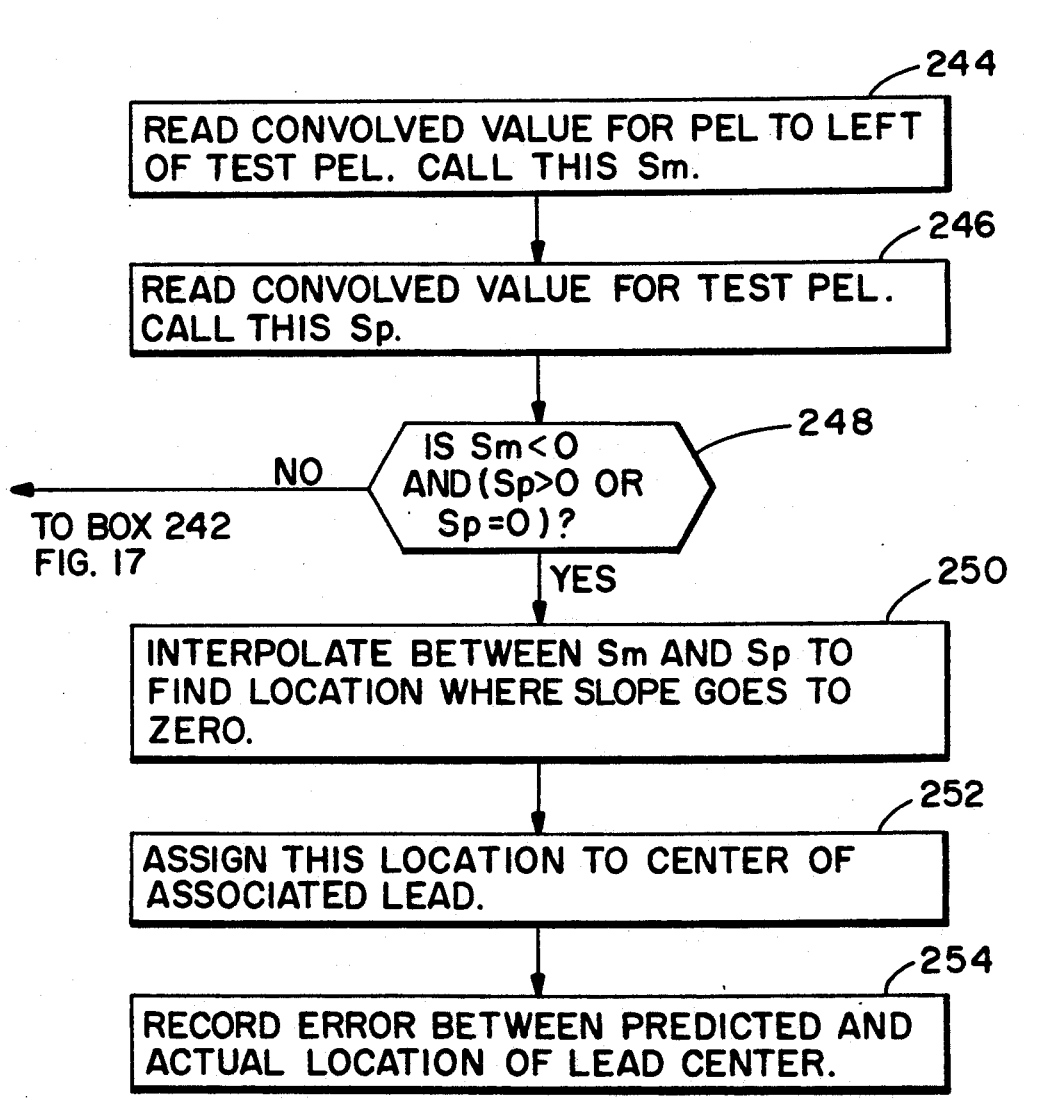

Turning to FIG. 18, and assuming that the condition shown in box 248 has been met, an interpolation is performed to find the zero slope location (box 250), and that location is assigned as the center of the next beam lead (box 252). At this time, any error between the predicted center of the beam lead and the actually found center location is recorded. (To be used as shown in box 236, FIG. 17.)

Figure 19:
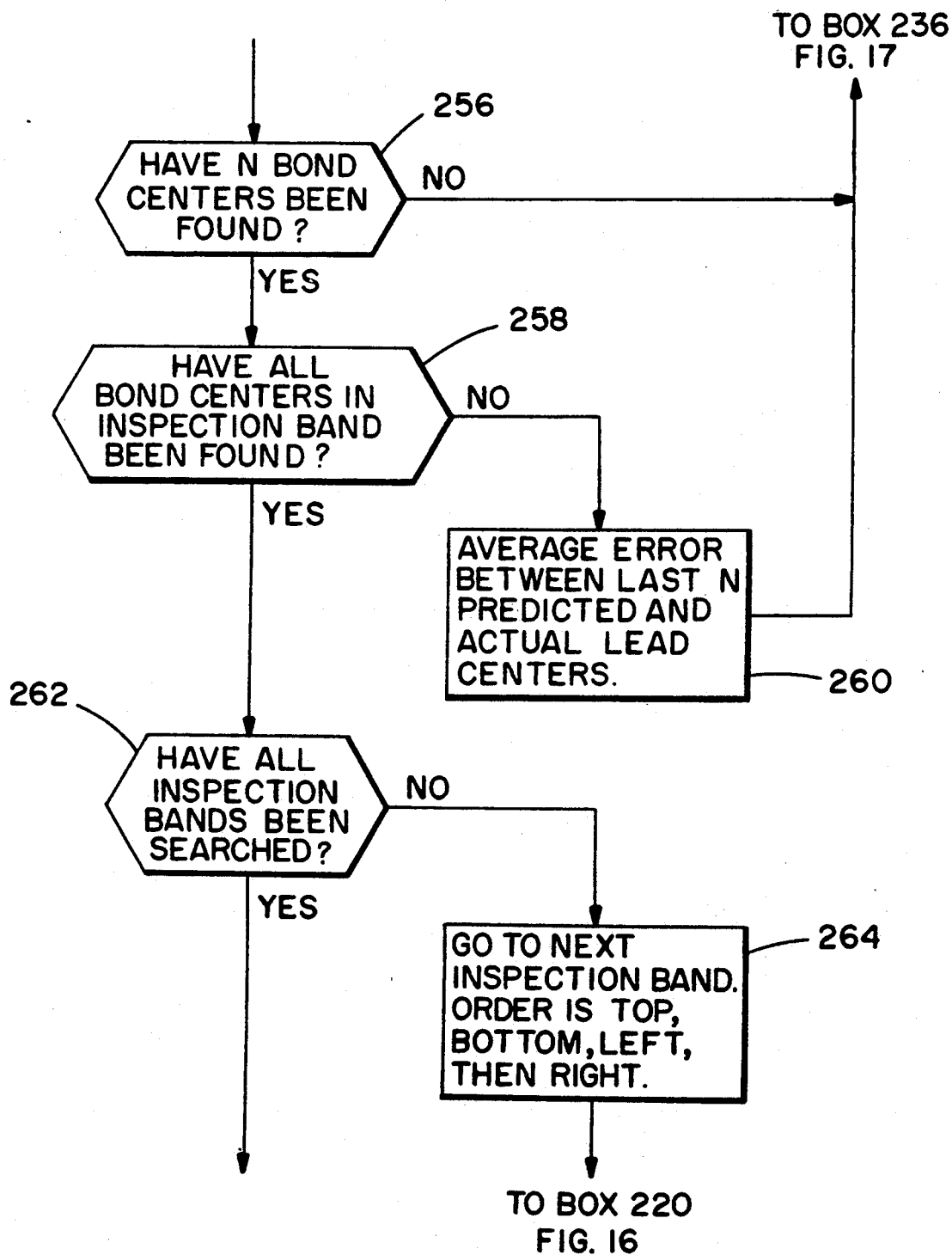
Figure 20:
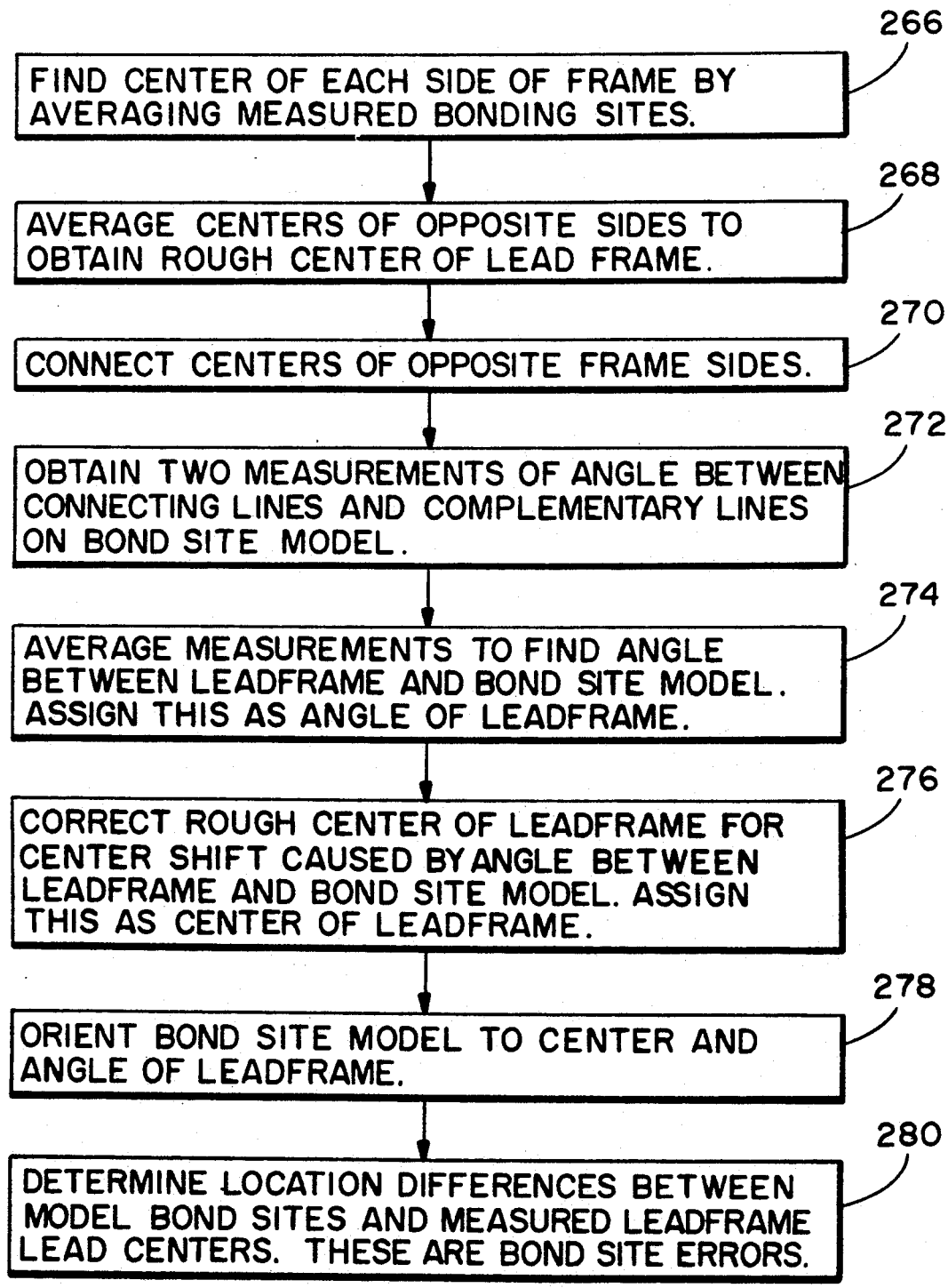
Figure 21:
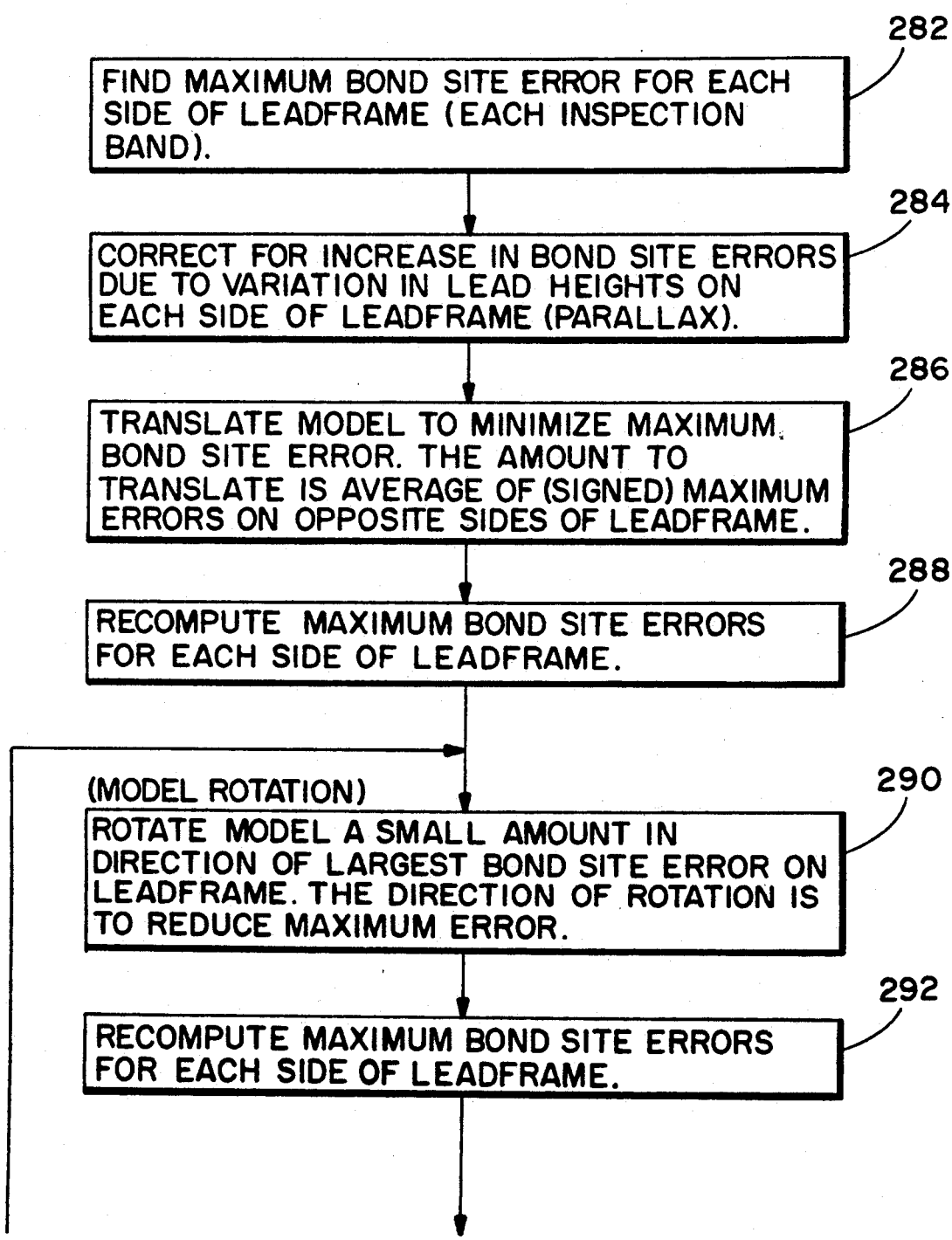
FIGS. 21–22 are high level flow diagrams of a lead frame fine positioning routine.
Figure 22:
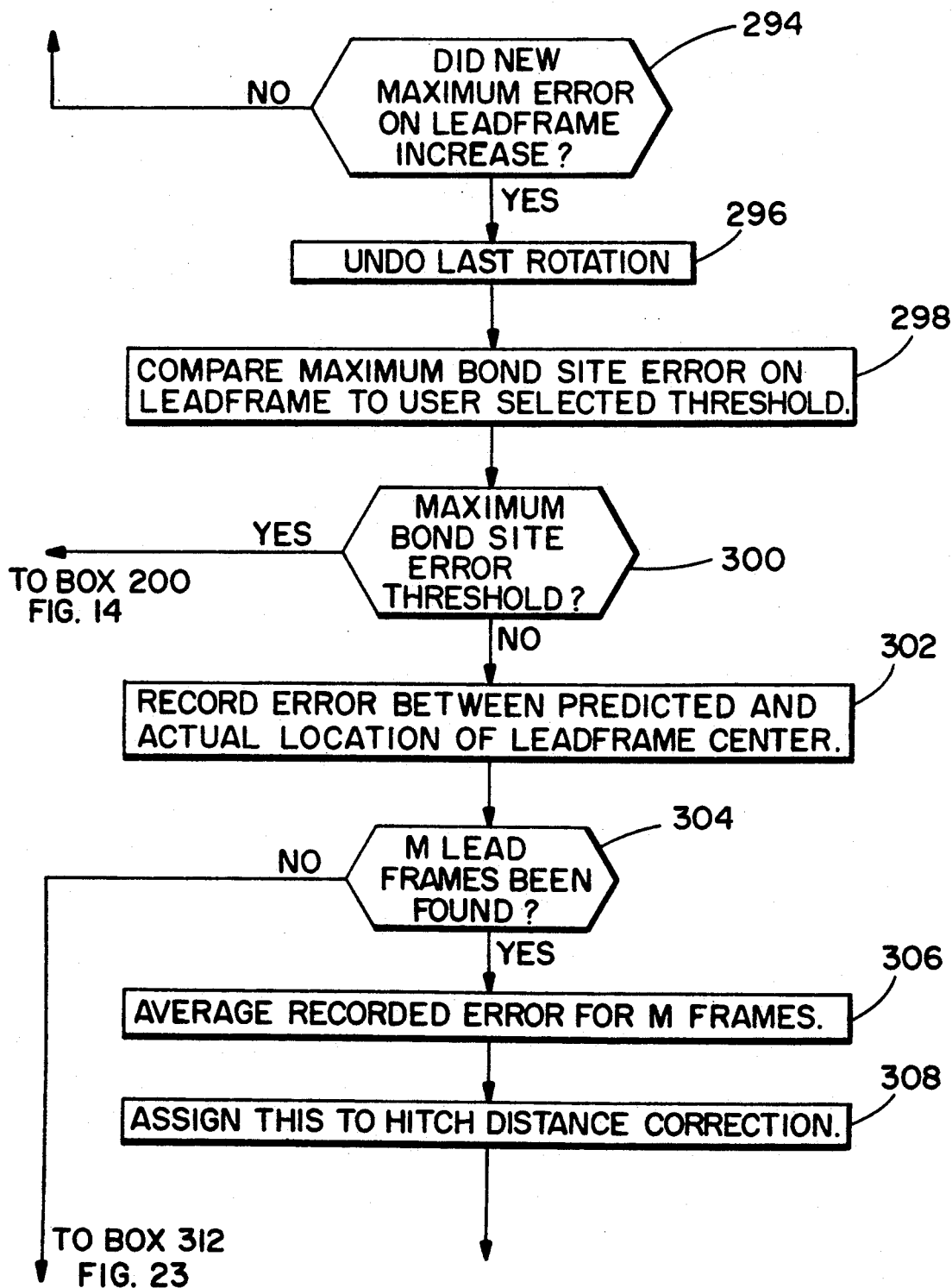

As shown in FIG. 19, the procedure continues by determining whether N bond centers have been found (box 256, and if not, returns to box 236 in FIG. 17 to continue the program. If N centers have been found, (box 25B), the program next inquires whether all bond centers in the inspection band have been found (box 258). If not, the average error between the last N predicted and actually found lead centers is determined (box 260), and the program recycles to box 236. If all bond centers in the inspection band have been found, the program inquires whether all inspection bands have been searched (box 262) and if not, the program cycles to the next inspection band and continues (box 264).

Once all inspection bands have been searched, the center position and angle of the lead frame is calculated. The precise equations for these calculations are given in Table 1.

TABLE 1

Known empirically
Let $(\bar{x}_b, \bar{y}_b)$ be the average position of all leads in each bank b.
Let $(\bar{x}_h, \bar{y}_h)$ be the average position of all leads in all horizontal banks.
Let $(\bar{x}_v, \bar{y}_v)$ be the average position of all leads in all vertical banks.
Let $(x_c, y_c)$ be the approximate center of the frame calculated by other means (only for chip).

Known a priori
Let $(\xi_b, v_b)$ be the average position of all leads in each bank b.
Let $(\xi_h, v_h)$ be the average position of all leads in all horizontal banks.
Let $(\xi_v, v_v)$ be the average position of all leads in all vertical banks.

To be calculated
Let $(C_x, C_y)$ be the center point of the frame in real space.
Let $\theta$ be the angle of orientation of the frame in real space.

Formulae
When b1 and b2 are horizontal banks, if
$dx = \bar{x}_{b1} - \bar{x}_{b2}$, $dy = \bar{y}_{b1} - \bar{y}_{b2}$, and $d\bar{\xi} = \xi_{b1} - \xi_{b2}$, then:

$$\sin\theta = \frac{d\xi dy + dx\sqrt{dx^2 + dy^2 - d\xi^2}}{dx^2 + dy^2}$$

When b1 and b2 are vertical banks, if
$dx = \bar{x}_{b1} - \bar{x}_{b2}$, $dy = \bar{y}_{b1} - \bar{y}_{b2}$, and $dv = \bar{v}_{b1} - \bar{v}_{b2}$, then:

$$\sin\theta = \frac{-dvdx + dy\sqrt{dx^2 + dy^2 - dv^2}}{dx^2 + dy^2}$$

TABLE 1-continued

When both horizontal and vertical banks are present:
$C_x = x_h + (x_v - x_h)\sin^2\theta - (y_v - y_h)\sin\theta\cos\theta + v_v\sin\theta - \xi_h\cos\theta$
$C_y = y_h + (y_v - y_h)\cos^2\theta - (x_v - x_h)\sin\theta\cos\theta - v_v\cos\theta - \xi_h\sin\theta$ When only horizontal banks are present, and the y-center is known:

$$C_x = x_h + \frac{(y_h - y_c)\sin\theta - \xi_h}{\cos\theta}$$

When only vertical banks are present, and the x-center is known:

$$C_y = y_v + \frac{(x_c - x_v)\sin\theta - v_v}{\cos\theta}$$

Broadly described, the above equations find the center of each side of the lead frame by averaging measured bond sites (box 266). The found centers are then averaged to obtain a rough center of the lead frame (box 268). Centers of opposite frame sides are then connected (box 270), and measurements are made of any angular differences between the connecting lines on the imaged lead frame and complementary lines on the bond site model. Those measurements are averaged to find the angle between the imaged lead frame and the bond site model, and that angle is assigned as the angle of the imaged lead frame.

At this point, the rough center of the imaged lead frame is corrected for any center offset and the new center is assigned as the center of the imaged lead frame (box 276). The bond site model is then altered in position so that its center and angle are coincident with the center and angle of the imaged lead frame (box 278). The above procedure provides a "best fit" for the lead frame which, in essence, minimizes the maximum error found for any lead in the lead frame. The algorithm proceeds to determine the location difference between each model bond site and each measured beam lead center. Any such location difference is assigned to the beam lead center as a bond site error.

The program now invokes a fine positioning procedure which enables a more precise alignment of the bond site model with the imaged lead frame. It commences by finding the maximum bond site error for each side of a lead frame. In essence, it inspects each inspection band and finds which determined beam lead center has a greatest difference from a model bond site (box 282).

The program then proceeds to correct for any increase in bond site errors which results from a variation in lead heights in the lead frame (box 284). This can better be understood by referring to FIG. 5 wherein a plurality of beam leads 104 are shown being imaged by camera 62. For exemplary purposes it is assumed that beam lead 110 has been bent downwardly out of the plane of the remaining beam leads 104. Initially, camera 62 has a focal plane f1 which is coincident with the plane of beam leads 104. It thus appears to camera 62 that the position of the beam lead 110 is at the intersection of ray 111 and focal plane f1, and beam lead 110 appears to be offset by a distance d from its actual horizontal position. This type of error has the property that it increases in proportion to the distance from the center of the inspection band. It also increases or decreases in relation to its distance from an imaging camera. Such errors may be identified and reduced by an averaging and fitting technique.

Next, the model is translated to minimize the maximum bond site error found in box 282. The amount the model is translated is equal to the average of the plus and minus maximum errors on opposite sides of the lead frame. Once this translation of the model has occurred, the maximum bond site error is recomputed for each side of the lead frame (box 288).

It is now assumed that any remaining bond site errors have resulted from a rotation of the imaged lead frame. As a result, the model is rotated a small amount in the direction of the largest bond site error seen on the imaged lead frame. The direction of rotation is set to reduce the maximum error (box 290). After that small amount of rotation, the maximum bond site error is then recomputed for each side of the lead frame (box 292). It is then determined whether or not that rotation increased the maximum error (box 294)—see FIG. 22. If the maximum error did not increase, the program recycles back to box 290 and another incremental rotation occurs.

When it is determined that the maximum error increases as a result of an incremental rotation, that rotation is undone (box 296), and the resulting maximum bond site error on the image lead frame is compared to a user selected threshold (box 298). If it is greater than the threshold (box 300), a new lead frame is incremented into the bond site position. If it is less than the user selected threshold, the maximum bond site error is recorded (box 302), and it is determined whether N lead frames have been found (box 304). If the answer is yes, the errors are averaged for the N frames (box 306) and the hitch distance is corrected (box 308) to enable the hitch feed mechanism to increment the next lead frame more closely into a proper bonding position (i.e., into window 26 in FIG. 1). In addition, the position of inspection band 105 is also shifted in a direction perpendicular to the motion of TAB tape 10 (i.e. Y axis) to enable inspection of the leads more closely to their bond sites.

From the aforementioned, it can be seen that the hitch distance of TAB tape 10 and the Y location of inspection bands 105 are continually updated and corrected by positioning errors found during this procedure. As a result, positioning errors which might otherwise tend to accumulate are continually corrected, thereby enabling the machine to proceed without interruption.

Figure 23:
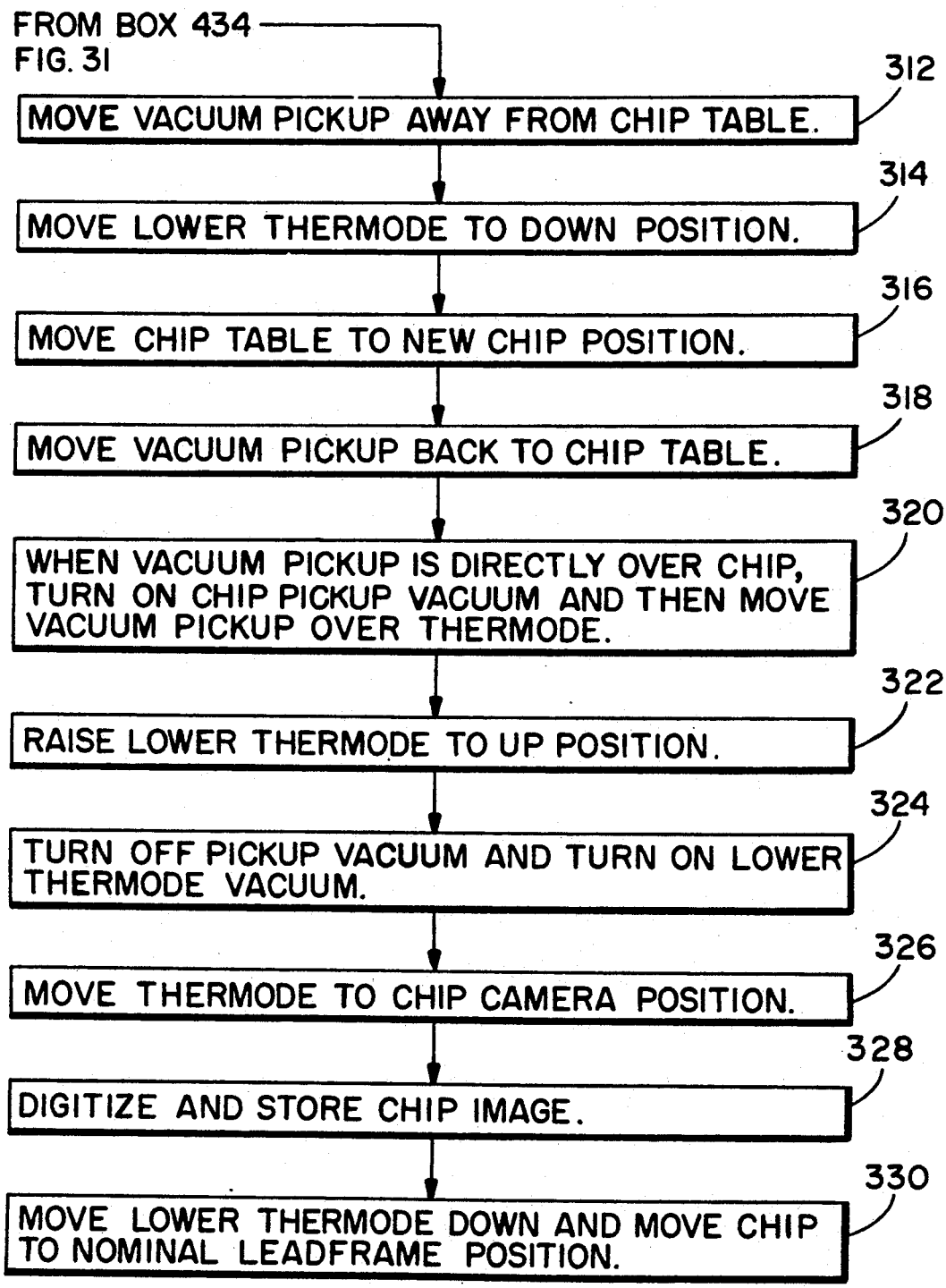
FIG. 23 is a high level flow diagram of a chip movement control routine.

If N lead frames have not yet been found, the program skips boxes 306 and 308 and proceeds to the chip movement and placement subroutine shown in FIGS. 23 etc.

Turning to FIG. 23, the chip movement control subroutine will be considered in conjunction with FIG. 1. Initially, vacuum pick-up 32 is moved away from the chip table (box 312), and thermode 36 is lowered to its down position (box 314). The chip table is moved to a new chip position (box 316), and vacuum pick up 32 is moved back to the chip table (box 318). When it is directly over a chip in a waffle holder, its vacuum is turned on (box 320), and a chip is lifted out of the waffle holder and held against the lower extremity of vacuum head 32. Vacuum head 32, with its chip, is positioned over thermode 36 and thermode 36 is then raised to its upper position (box 322). At this point, the vacuum on pick-up head 32 is turned off and the vacuum supplied to thermode 36 is turned on, thereby causing the chip to be transferred from head 32 to thermode 36 (box 324). Thermode 36 is then moved into the view of chip camera 60 (box 326), and the chip's image is digitized and stored (box 328). Thermode 36 is then lowered and moved to the nominal lead frame position (box 330).

Figure 6:
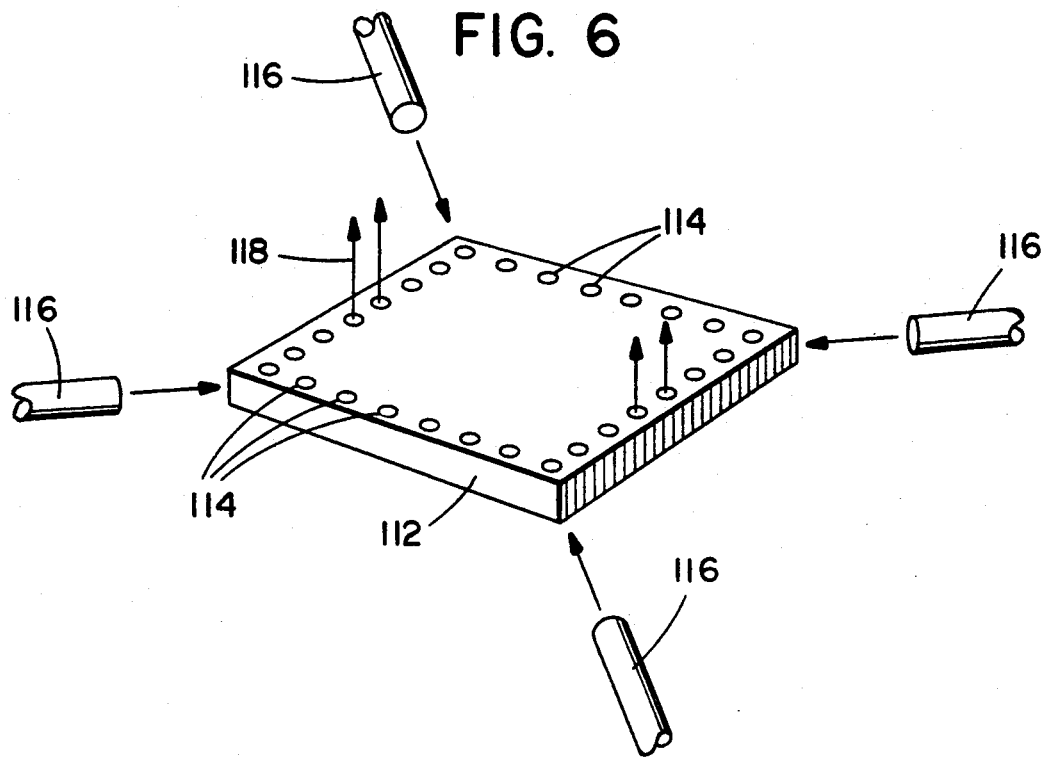
FIG. 6 is a schematic view illustrating the use of grazing light to enable imaging of chip contact bumps.
Figure 24:
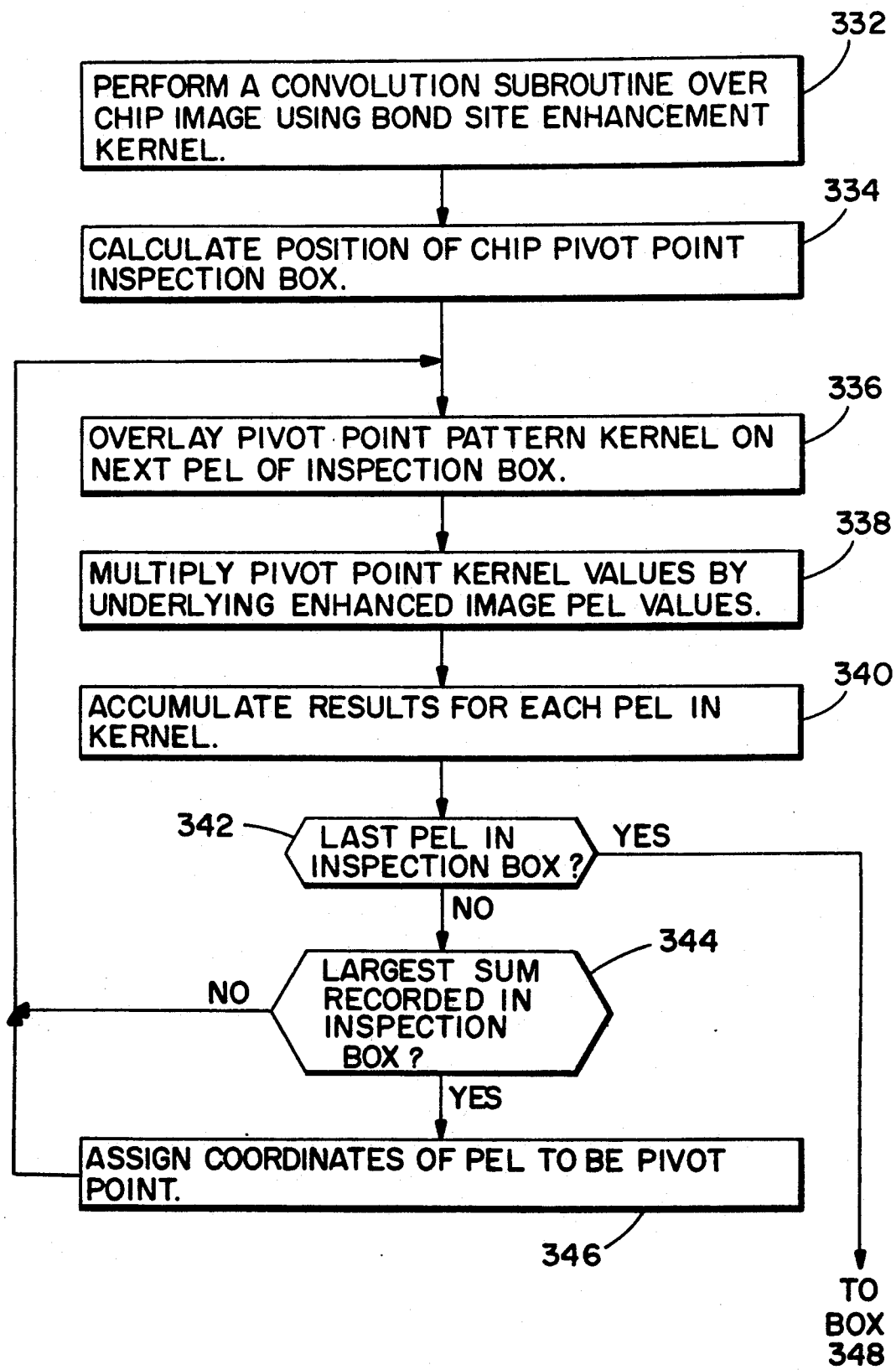
FIGS. 24–31 contain a high level flow diagram illustrating the chip position/inspection imaging routine.

In FIGS. 24 et seq., additional details of the chip inspection and positioning routine are illustrated. Initially, a convolution subroutine is performed over the chip image using a bond site enhancement kernel (box 332). This operation can be better understood by referring to FIGS. 6–9. As shown in FIG. 6, a chip 112 is shown as it is positioned on thermode 36. Each contact area on the upper face of chip 112 is configured as a conductive "bump" which is convex in shape and extends above the upper surface of chip 112.

It is critical to the further functioning of this routine that each of the contact bumps 114 be precisely imaged so that both the position of chip 112 and its contact bumps can be determined. To accomplish this, a plurality of side lights 116 are provided, each one being positioned adjacent a corner of chip 112. The light beams emanating from each of lights 116 are designed so that they are parallel to the uppermost surface of chip 112 and just graze the upper surfaces of contacts 114. As a result, the only light which is reflected upwardly (as evidenced by arrows 118) is that which impinges upon the upper surfaces of contacts 114. Due to the fact that the light beams are essentially parallel to the surface of chip 112, little or no light is reflected therefrom into an imaging camera.

Figure 7:
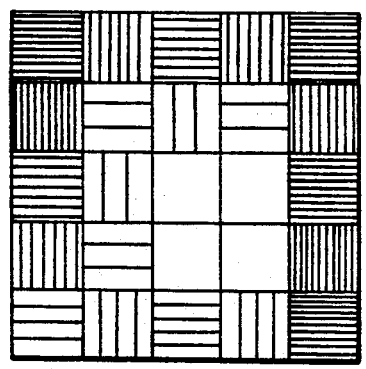
FIG. 7 is a view showing an imaged, non-enhanced contact bump.

In FIG. 7, a rendering of a four by four pel imaged convex contact 114 is shown before it is enhanced. The variations in reflectivity thereof may result from a malformation of a contact, a change in its reflectivity characteristics over its surface, the fact that the reflected light comes from four sources, all at different distances, etc.

Figure 8:
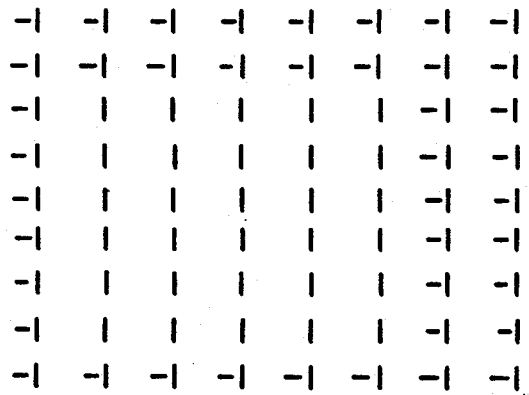
FIG. 8 shows a contact bump enhancement kernel.

To enhance the image of chip contacts, a bond site enhancement kernel, such as is shown in FIG. 8, is employed. The convolution subroutine superimposes the site enhancement kernel over the digitized image of the upper surface of chip 112, modifies each overlaid image pel by the value shown in the kernel pel that overlays the imaged pel, and then sums all of the values. This summed value is then assigned to a center pel in the kernel, and the kernel is moved one pel to the right and the procedure repeated.

Figure 9:
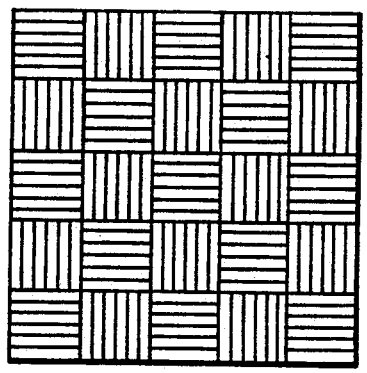
FIG. 9 shows an enhanced image of a contact bump after application of the enhancement kernel.
Figure 10:
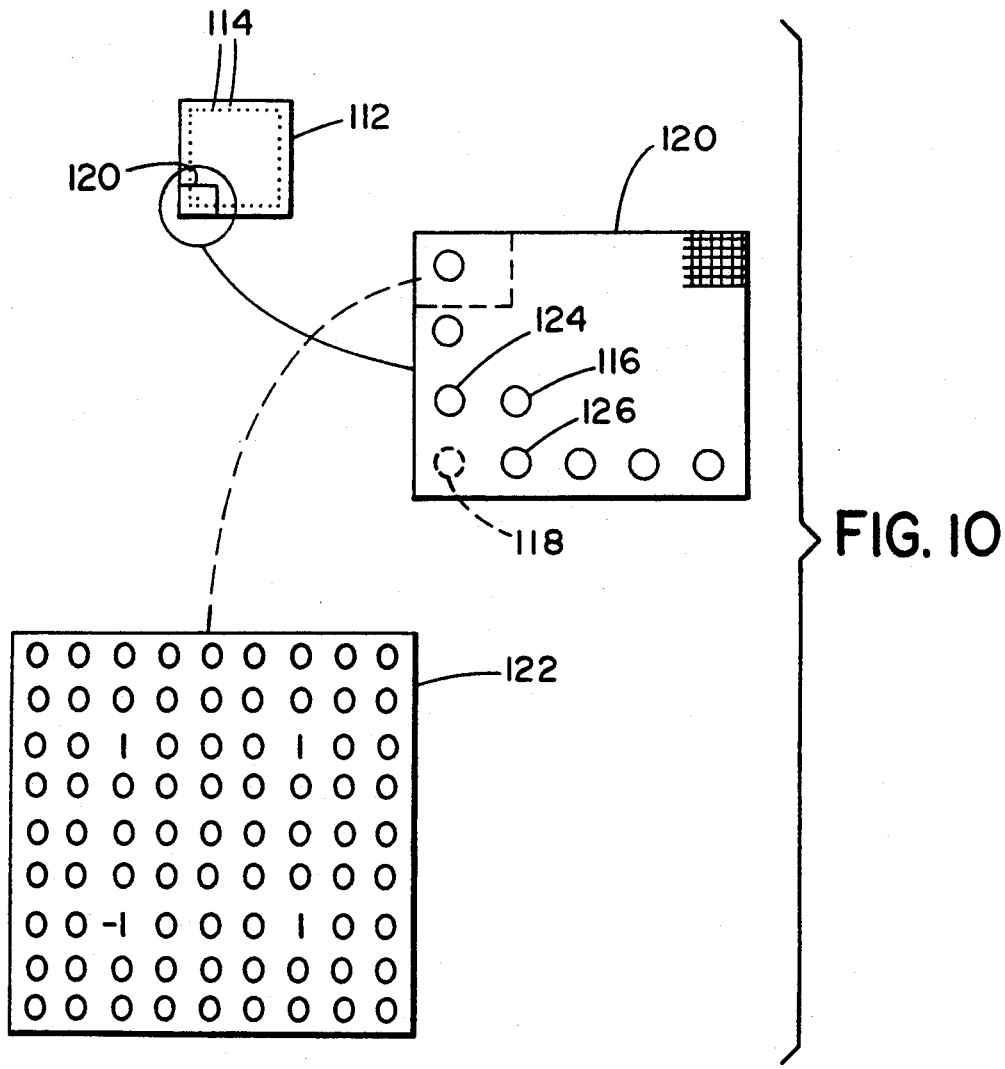
FIG. 10 illustrates a chip surface and how the pivot point of a chip can be determined by application of a pivot point kernel.

After the site enhancement kernel has been sequenced over all pels of the image, the image pels will have been convolved and those which image the contacts will be substantially enhanced. Since there is very little light, (if any), reflected from the upper surface of the chip, the areas between the pels will remain dark. It should also be understood that the effect of a convolution acting on any constant background is to substantially eliminate the background contribution. The details of the convolution subroutine are shown in FIG. 15. An enhanced pel image of a contact is shown in FIG. 9.

After the bond site enhancement routine is completed, the position of the chip's "pivot point" is found. Chip contact patterns are generally arranged so that there is one unique arrangement of contacts to enable determination of the orientation of the chip. This can be seen by examining FIG. 10 where a plan view of chip 112 is shown with its contacts 114. The lower left corner of chip 112 has a unique contact pattern which is shown expanded to the right of the FIG. There, it can be seen that the position of contact 116 is unique to the chip and defines the area where the chip's pivot point can be found. In fact, the pivot point is designated by dotted circle 118 and is essentially an imaginary point about which the angular position of the image of chip 112 can be determined and adjusted.

To determine the pivot point location and the angle of the chip image about that location, the position of a chip pivot point inspection box 120 is calculated (box 334, FIG. 24). A pivot point pattern kernel 122 (FIG. 10) is then employed to determine the position of pivot point 118. Kernel 122 has a "1" value assigned to the respective pels which are centered on imaged contacts 116, 124, and 126. A "−1" value is assigned to the pel centered on pivot point 118. Since the exact centers of contacts 116, 124, and 126 are not known in the imaged pattern, a pivot point pattern kernel 122 is used to identify those features. It is first overlaid onto inspection box 122, starting at its upper left corner (box 336). Then, the underlying pel values in the imaged contact pattern are multiplied by the overlaid kernel pel values (box 338), and the results accumulated for each pel in the kernel.

As each pel calculation is completed, it is determined whether there are any additional pels to examine (box 342). Assuming that additional pels are to be examined, the program continues to box 344 where it determines if the last sum is the largest yet recorded. If it is, then the coordinates of that pel are temporarily assigned as the pivot point (box 346). The program then cycles back to box 336 and the next pel is accordingly handled. Thus, as each pel is processed, the pivot point pel is updated to indicate the position of the pel which has the highest value resulting from the pivot point kernel calculations.

Figure 11:
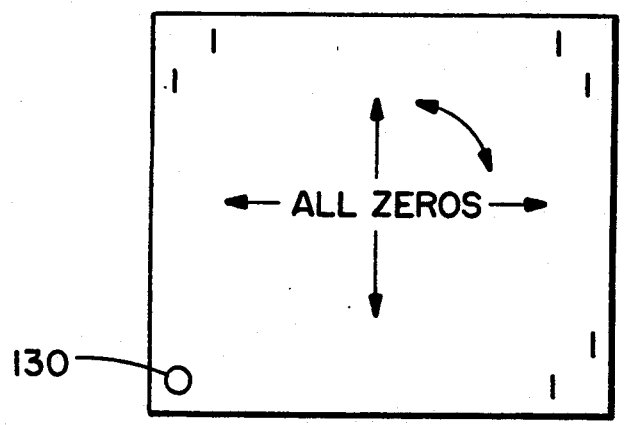
FIG. 11 illustrates a rotation kernel.
Figure 12:
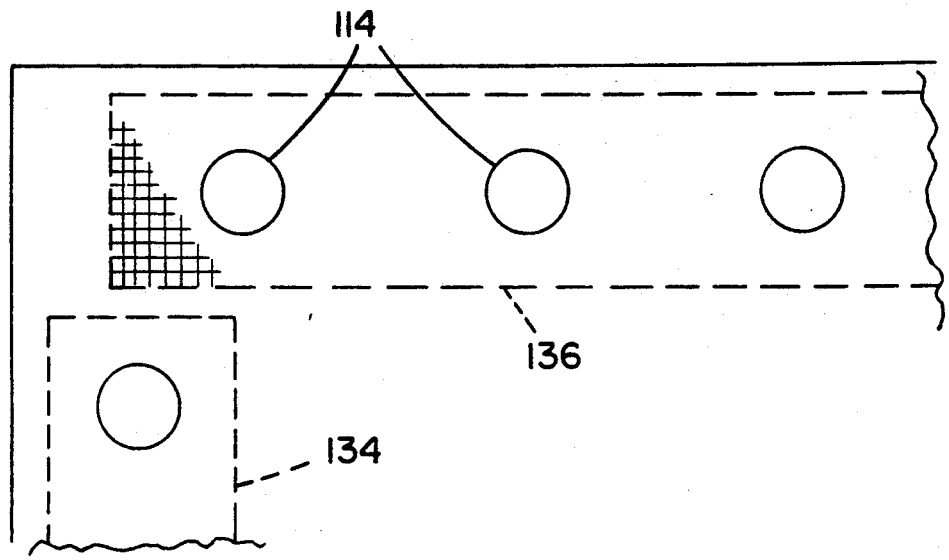
FIG. 12 illustrates a plurality of contact bumps on a chip surface, showing placement of inspection bands.
Figure 13:
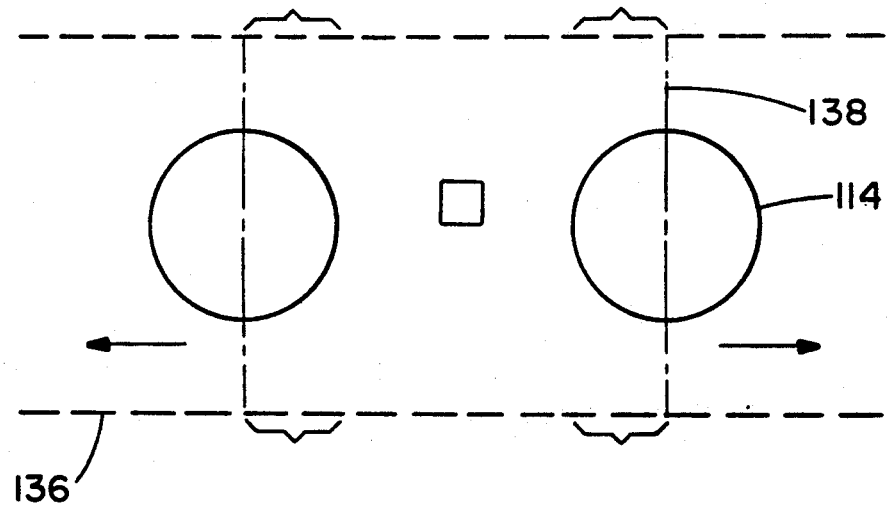
FIG. 13 shows the placement of an inspection box for finding the centerpoint between adjacent contact bumps.
Figure 25:
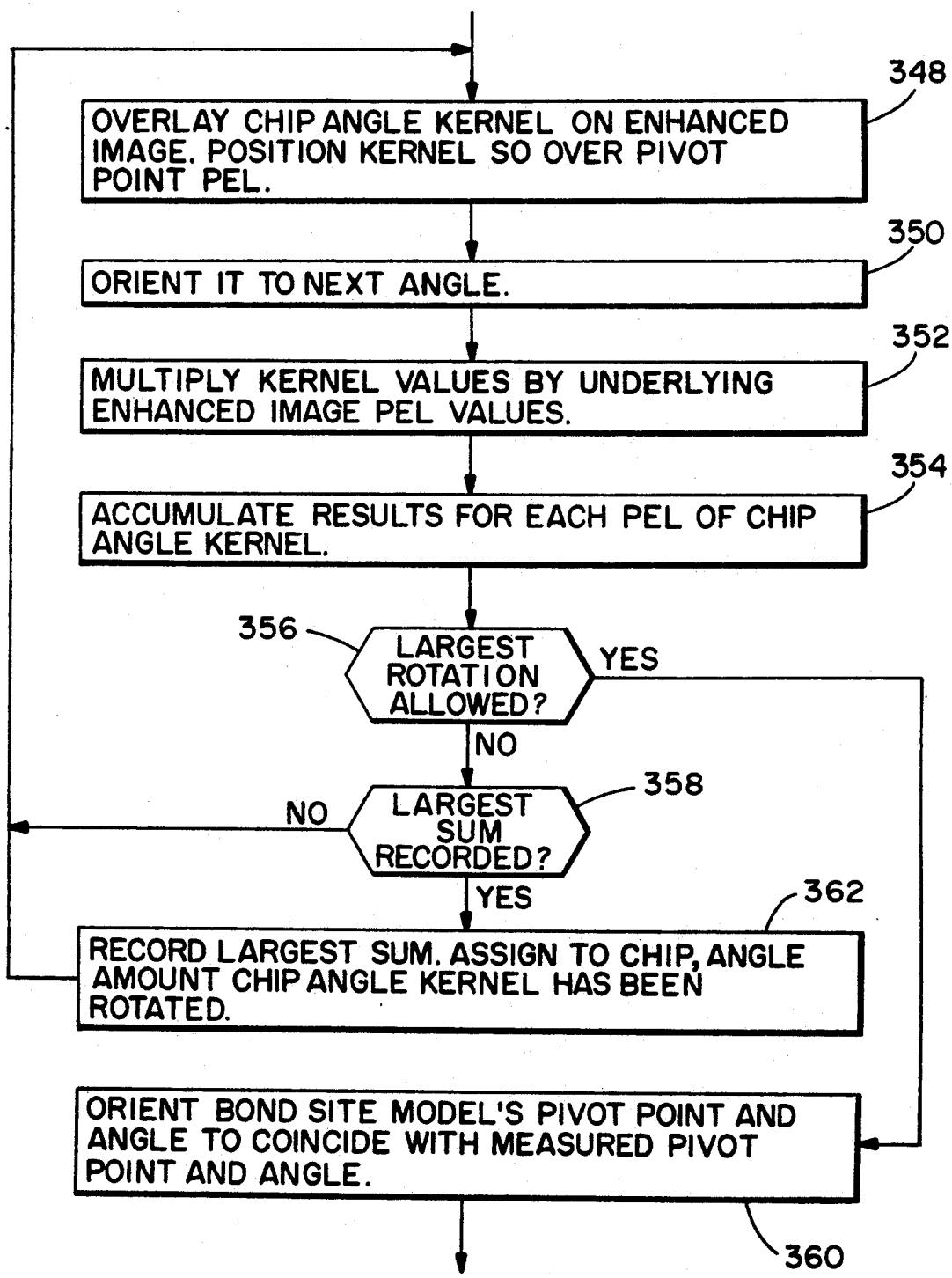

Once the last pel in the inspection box has been examined and the pivot point determined, the program proceeds to FIG. 25 and box 348. As shown in FIG. 11, a chip angle kernel 122 is overlaid on the enhanced chip image and is positioned so that its pivot point 130 is centered on the previously determined chip pivot point. All pels of kernel 122 are zeros except those at each of three corners where a pair of adjacent contact point pels are assigned one values. The chip angle kernel is then rotated by a small angle (box 350), and its kernel values are multiplied by the underlying enhanced image pel values (box 352). The results of each such calculation are accumulated (box 354) and then it is determined whether the rotation of the chip angle kernel is the largest allowed. If not, it is determined whether the sum just recorded is the largest and if it is (box 362), that sum is assigned to the chip angle amount which the chip angle kernel has been rotated.

At this point, the program recycles and continues to rotate the chip angle kernel, first in one direction to a maximum angle and then to another direction until it reaches a maximum angle. Once the largest rotations have been reached, the largest sum assigned to an angle indicates the angle of the imaged chip. Now, the bond site model's pivot point and angle are adjusted to coincide with the determined pivot point and angle of the enhanced image contact pattern. Thus, the chip contact model is now oriented in accordance with the orientation of the imaged chip contacts.

At this stage, it is necessary to determine the center of each of the chip contacts in the chip image. This determination is accomplished in a manner similar to that used previously to find the beam lead centers in the imaged lead frame and is described in detail in FIGS. 26-31.

Figure 26:
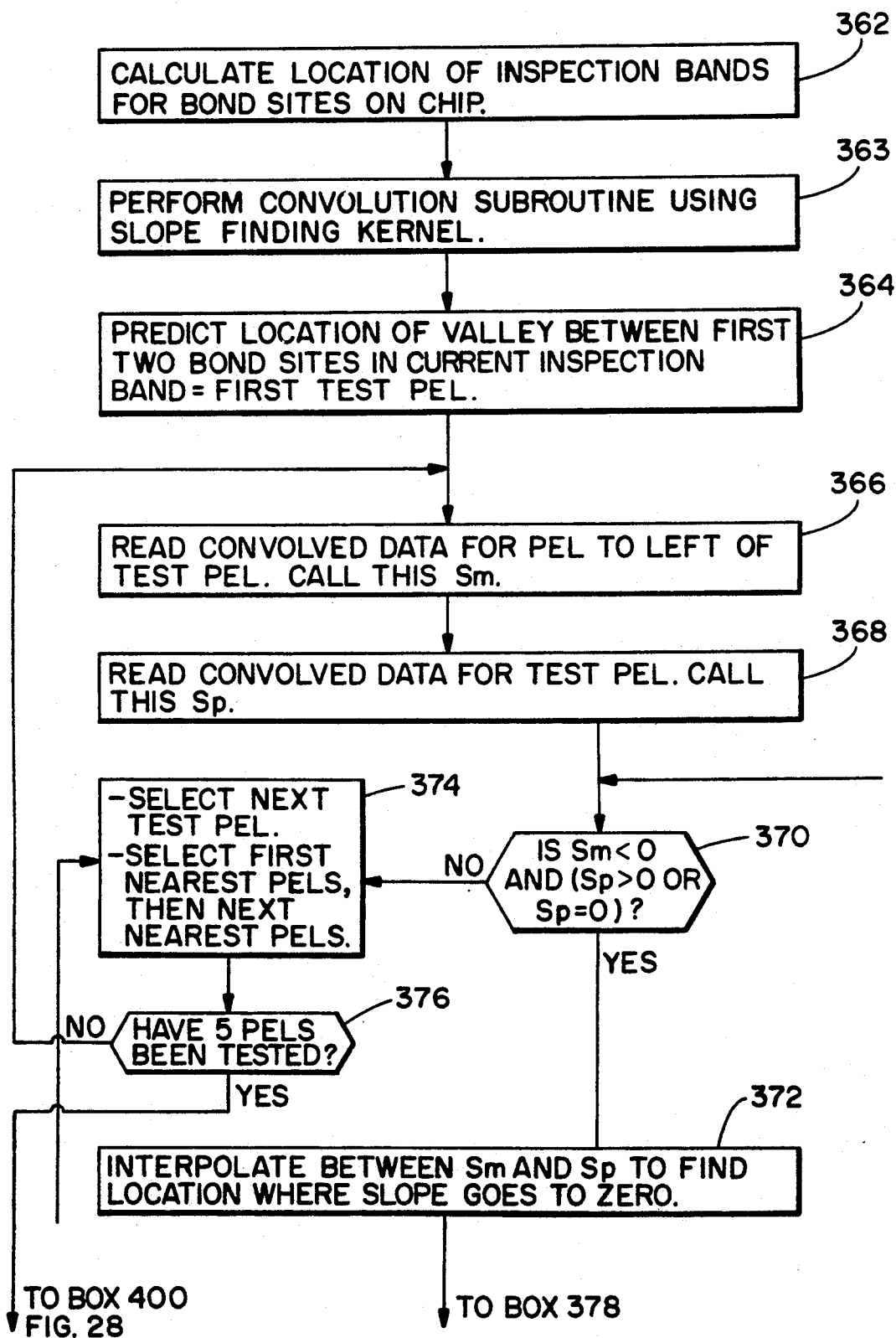

As shown in FIG. 26, the location of inspection bands is first calculated for all bond sites (chip contacts). This can be visualized by referring to FIG. 12 wherein a pair of inspection bands 134 and 136 are shown encompassing chip contacts 114. This procedure additionally uses an inspection box 138 (FIG. 13) to aid in determining the contact centers. The procedure differs from the lead frame bond site algorithm, because each chip contact 114 is imaged as a bright site. It is to be remembered that each beam lead was imaged as a dark site. The use of a bright, highly reflective image to determine sub-pel locations is to be avoided as any change in light intensity of the image can greatly vary the positional results achieved.

As a result, the algorithm used for finding contact bond site centers depends upon finding the dark center point between a pair of contacts 114, using a slope finding kernel. Once the center point between adjacent contacts is found, the contact point centers can be determined with great accuracy.

Contact center determination commences by first calculating inspection bands (box 362), and then performing a convolution subroutine using the same slope finding kernel as shown in FIG. 4. The convolution routine is identical to that shown in FIG. 15. Once the convolution subroutine has been completed (box 363), the pel location of a first "dark" valley between the first two bond sites is predicted from the chip model. That predicted pel is assigned as the first test pel (box 364). The convolved data for that pel and the pel to its immediate left are read and assigned as Sp and Sm (boxes 366, 368). A slope test is applied to those values (box 370) and if the indicated AND condition is not met, adjacent pels are tested (box 374). After five pels have been tested (box 376) and the slope AND condition still not met, a contact problem exists, and the program increments to box 400, FIG. 28 where the chip is removed and the program recycles.

On the other hand, if the slope test AND condition is met, then an interpolation occurs between Sm and Sp to find the precise location where the change of light slope goes to zero (box 372). The program then determines if another dark valley minimum exists (box 378) and if so, it determines whether the pel intensity nearest the new minimum is less than the pel intensity nearest the old minimum (box 380). This covers the case where more than one minimum is found between two contacts. The lowest intensity minimum is the one which is assigned the true midpoint (box 382). Until five pels have been tested (box 384), the program continues to recycle back to box 370.

Once five pels have been tested (box 384), any error between the predicted and actual locations of the first midpoint between contacts is recorded (box 386). This value is assigned to the "average prediction" error. Then, the next valley location is predicted (box 388), and the program continues by choosing the next test pel (box 390, FIG. 28). The slope finding test is repeated in boxes 392, 394, and 396. Again, if the slope test is not met, and five pels have been tested (box 398), the chip is returned to the chip table (box 400). If the slope test is met, an interpolation occurs between Sm and Sp to find the location where the slope is zero (box 402). This minimum is assigned as the midpoint between the contacts (box 404), and the error between the predicted and actual locations of the midpoint is recorded (box 406).

Figure 27:
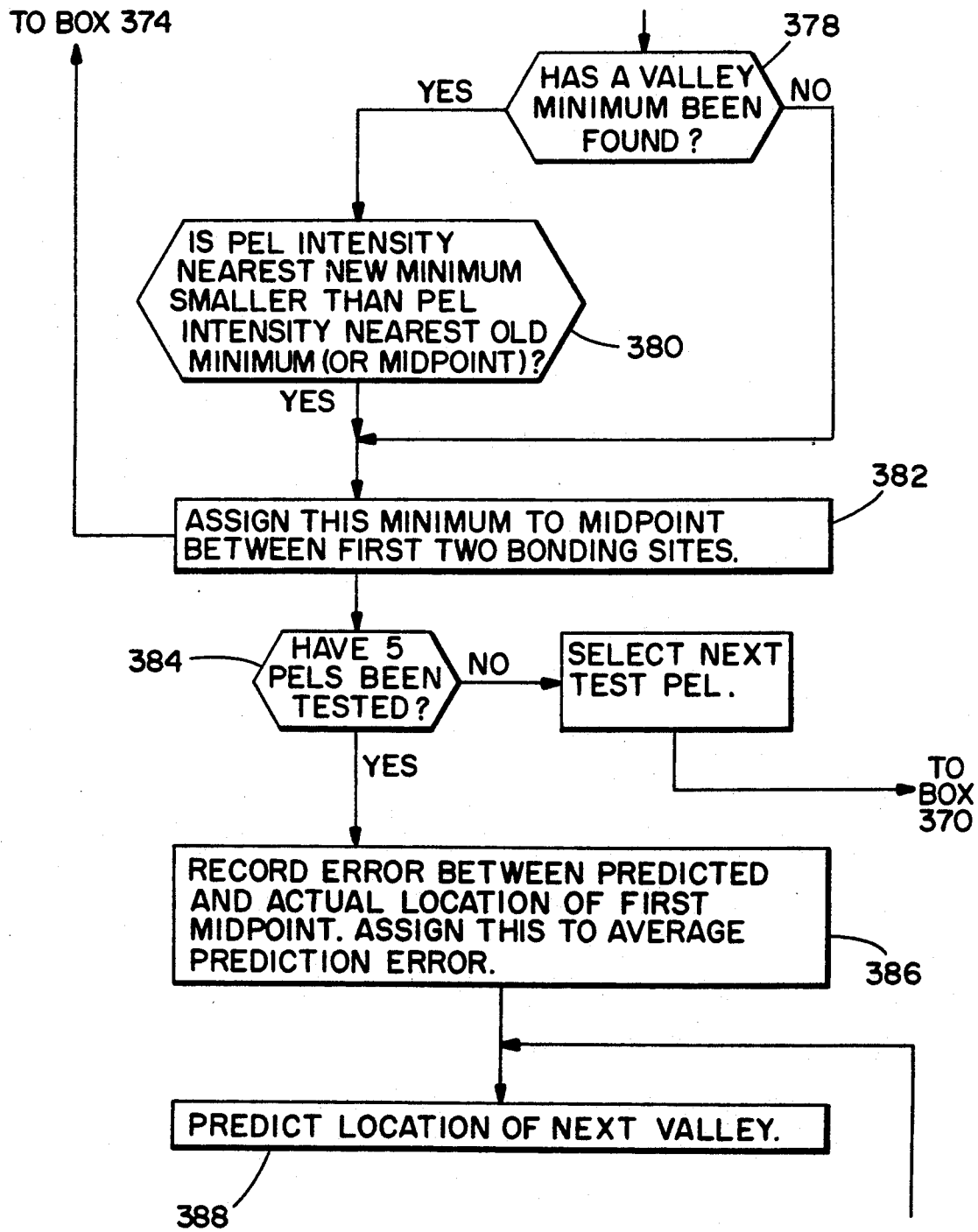
Figure 28:
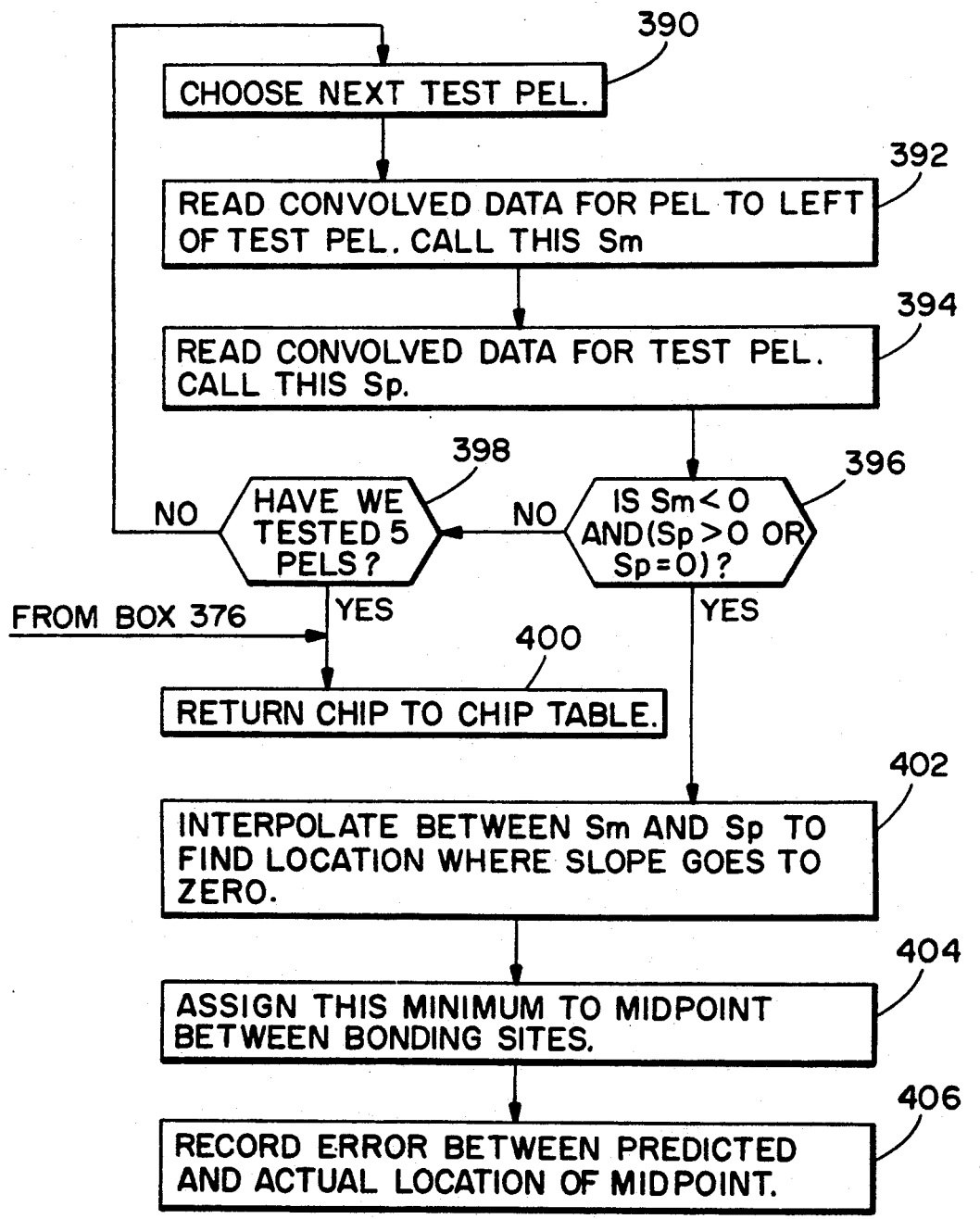
Figure 29:
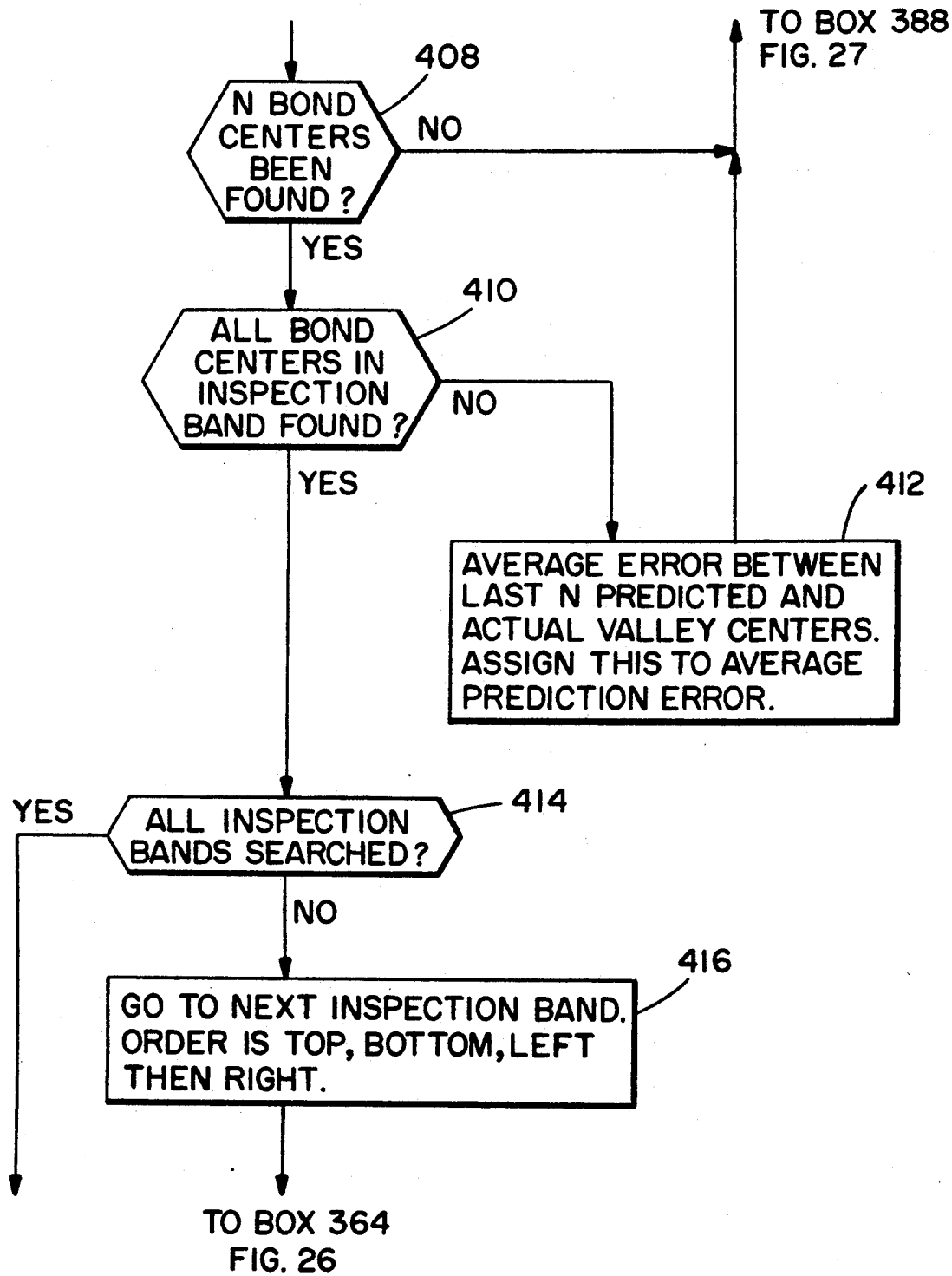

The program then proceeds to FIG. 29 where it asks whether N bond centers have been found (box 408) and if not, it recycles back to box 388 in FIG. 27. If N centers have been found, it asks whether all bond centers in the inspection band have been found (box 410) and if not, it averages the error between the last N predicted and actual valley centers and assigns this as the average prediction error. The program then recycles back to box 388, FIG. 27 and continues.

Figure 30:
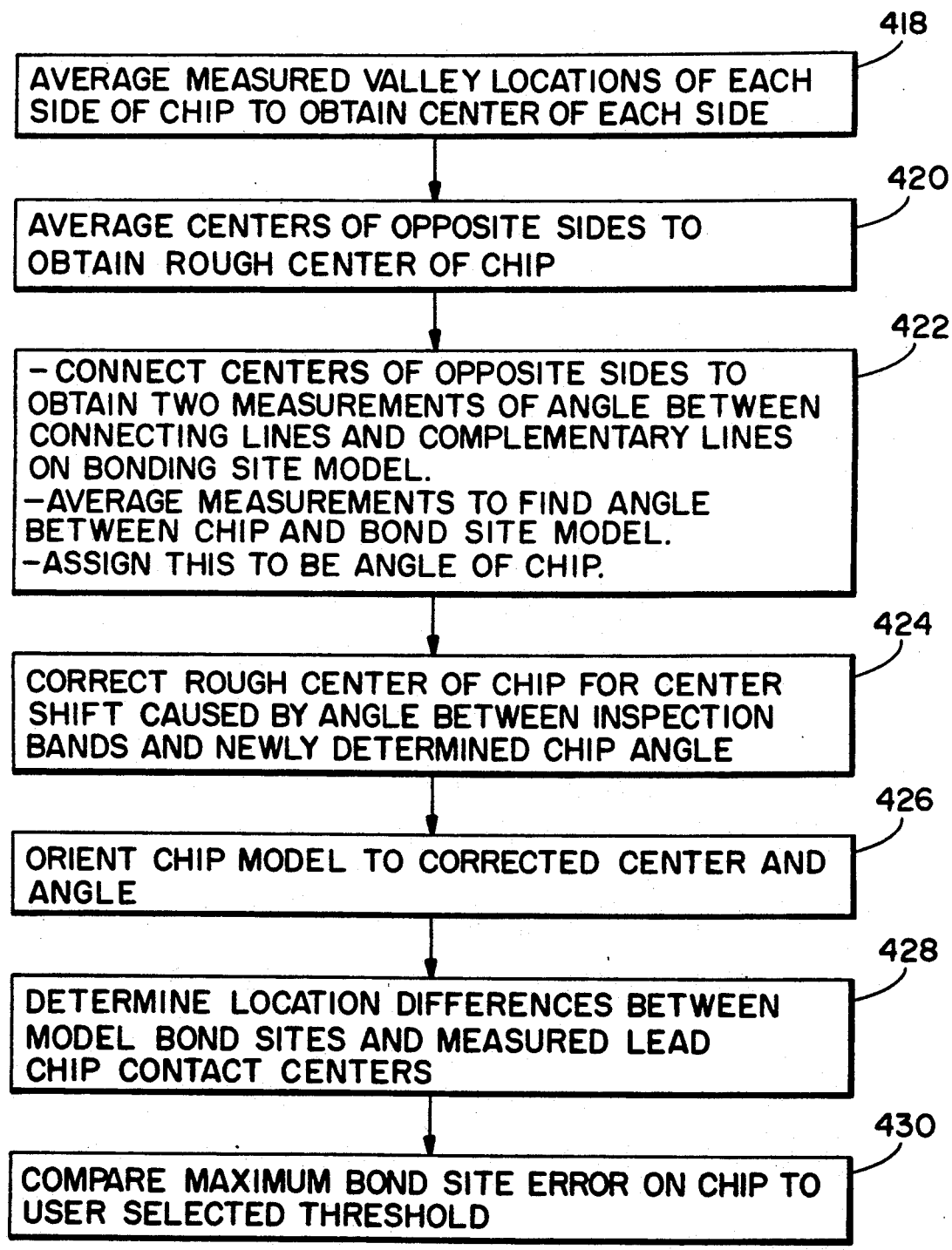
Figure 31:
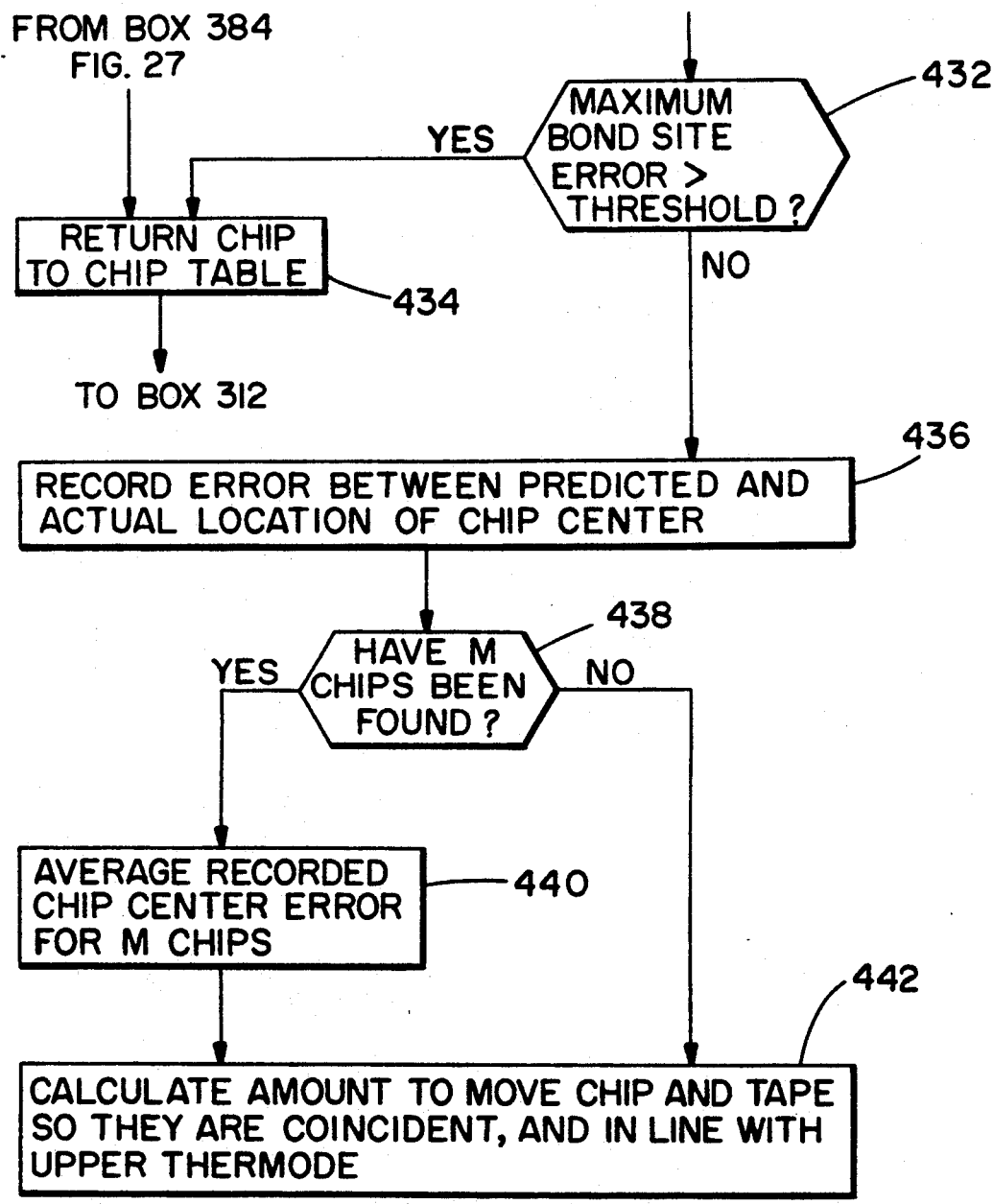

If all bond centers in an inspection band have been found and all inspection bands searched (box 414), the program continues to FIG. 30. On the other hand, if remaining inspection bands are yet to be searched (box 416), the program repeats as shown.

Turning now to FIG. 30, the "Fit of Measured Valley Positions" routine is illustrated. The aim of this routine is to find the center and angle of the imaged chip. This is accomplished by first averaging the measured valley locations for each side of the chip to obtain the center of each side (box 418), and then averaging the found centers to obtain a rough center for the chip (box 420). The centers of opposite sides of the chip are then connected and the angles between the connecting lines and complementary lines on the bond site model are determined. Those measurements are in turn, averaged to find the angle between the chip and the bond site model and this angle is assigned as the angle of the chip (box 422).

The rough center of the chip, determined as shown in boxes 420 and 422, is corrected using the angle between the chip and the bond site model (box 424). See also Table 1. The chip contact model is oriented to the corrected center and angle (box 426). Then, the location differences are determined between the model bond sites and the measured chip contact centers. A maximum bond site error is thus determined and is compared to a user selected threshold (boxes 428, 430).

If the maximum bond site error is found to be greater than the threshold (box 432, FIG. 31), the chip is returned to the chip table (box 434). If not, the error between the predicted and actual location of the chip center is recorded (box 436). Then, it is determined whether M chips have been found and if so, the recorded chip center errors over M chips are averaged (box 440).

Subsequently, the program proceeds to box 442 where a calculation occurs to determine the amount to move the chip and the tape so that they are coincident and in line with the upper thermode. As is now apparent, the lead frame bond site model is now aligned in accordance with the imaged lead frame and the chip contact model is aligned with the imaged chip contacts. Thus, by examining the relative positions of the two models, the translation and rotation amounts for the chip and the translation amount for the tape can be determined which will bring them into positional coincidence at bond time. Additionally, the translation and rotation necessary to bring upper thermode 48 precisely over the chip/tape are determined.

Figure 32:
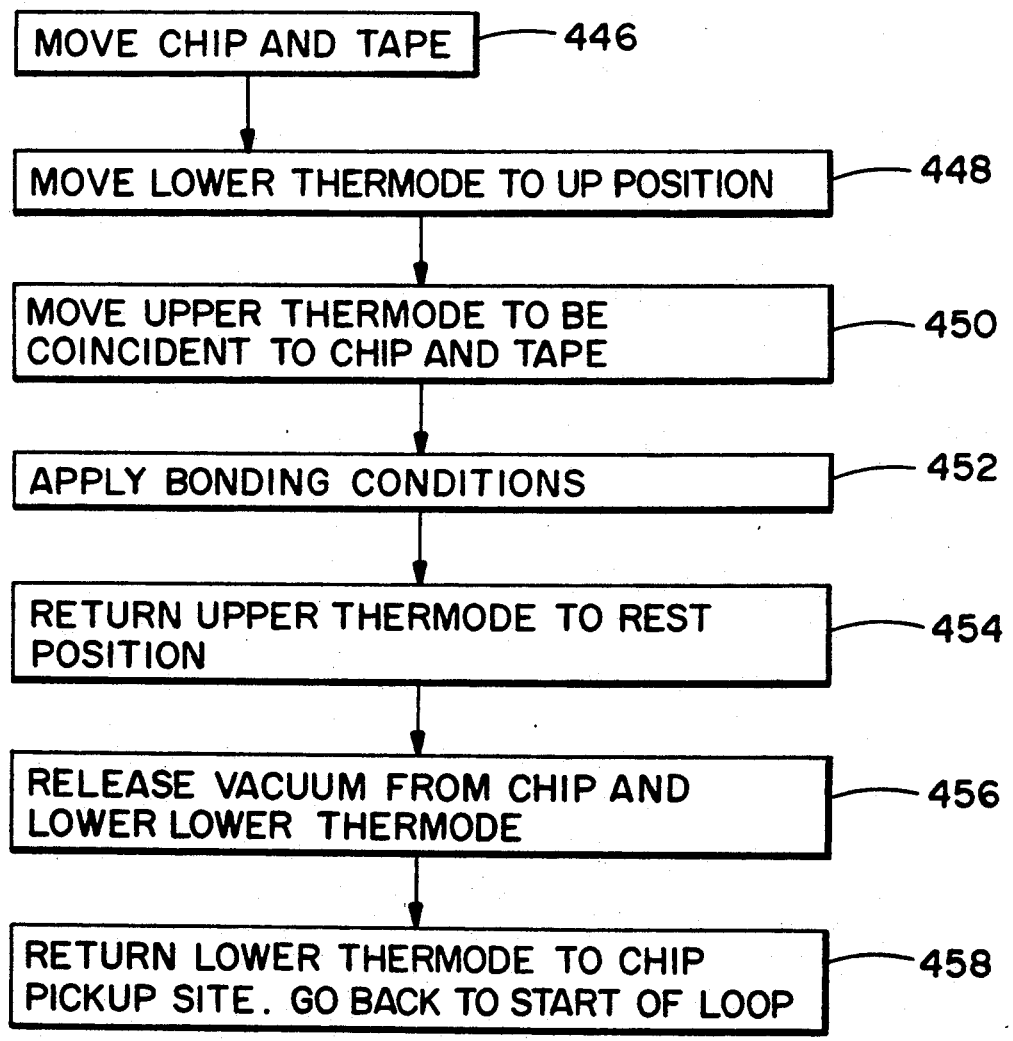
FIG. 32 illustrates a high level flow diagram of final chip positioning and bonding.

The control system now causes the thermodes and tape to move accordingly (box 446, FIG. 32). This is followed by lower thermode 36 being moved to the upper (bonding) position (box 448). Upper thermode 48 is then moved down to bear upon the chip and TAB tape (box 450), and bonding conditions are applied (box 452). After bonding, thermode 48 is returned to its rest position (box 454), the vacuum holding the chip to thermode 36 is released and it is lowered away from the now bonded chip/lead frame (box 456).

The above system and method enable positional accuracies of +/−2 microns to be achieved and for a chip placement and bonding to occur in approximately 6 seconds. Such accuracy and speed are obtained notwithstanding the fact that the pel size used by the imaging system is 25 microns on a side.

It should be understood that the foregoing description is only illustrative of the invention. Various alternatives and modifications can be devised by those skilled in the art without departing from the invention. For instance, while, for purposes of explanation, two models have been described—i.e., a band site model for the lead frame and a contact pattern model for the chip, a single model encompassing all bond sites/contacts can be utilized. Accordingly, the present invention is intended to embrace all such alternatives, modifications and variances which fall within the scope of the appended claims.

We claim:

1. A method for aligning a contact pattern on an electronic device held by a first movable support, with a bond site pattern on a lead frame held by a second movable support, comprising the steps of:
   a. creating and storing precise models of contact and bond site patterns;
   b. deriving images of said electronic device contact pattern and said lead frame, said electronic device and lead frame to be hereafter moved by said first and second movable supports into a bonding position to enable said electronic device contact pattern to be bonded to bond sites on said lead frame;
   c. determining the position of contacts in said imaged contact pattern, and reorienting said contact pattern model to a best fit with said determined contact positions;
   d. determining the position of bond sites on said imaged lead frame, and reorienting said bond site model to a best fit with said determined bond site positions;
   e. finding positional differences between said reoriented bond site and contact pattern models; and
   f. generating signals to reorient said first and second movable supports to minimize said positional differences when said first and second supports are moved into said bonding position.

2. The method as defined in claim 1 wherein said deriving step (b) includes storing a plurality of gray scale value pels which comprise said images, said pels having dimensions that are larger than dimensional resolutions required by said method, said step (d) further comprising the sub-steps of:
   d1. illuminating said lead frame to render leads therein in shadow;
   d2. finding pels close to a bond site;
   d3. determining the slope of gray scale value change of said close pels to find a pel whose change is a first value and is adjacent a second pel whose change is either zero or a second opposite sign value to said first value; and
   d4. interpolating between said close pels to determine a position where said slope change of gray scale value is approximately zero and is indicative of a light minima and assigning that position as a bond site.

3. The method as defined in claim 2 wherein, subsequent to said step d4, the method further comprises:
   d5. deriving from said determined bond sites, a center and angular orientation of said imaged lead frame.

4. The method as defined in claim 3, wherein subsequent to said step (d5), the method further comprises the step of:

d6. determining if either said derived center or angular orientation of said imaged lead frame differs by more than predetermined limits from said bond site model center or angular orientation, and if not;

d7. reorienting said bond site model by moving its center and angular orientation to match that of said imaged lead frame.

5. The method as defined in claim 4 wherein said illumination of said lead frame causes individual beam-leads to be imaged as dark, gray scale value pels.

6. The method as defined in claim 1, wherein said deriving step (b) includes storing a plurality of gray scale value pels which comprise said images, said pels having dimensions that are larger than dimensional resolutions required by said method, said step (c) further comprising the steps of:

c1. illuminating said contact pattern so as to render spaces therebetween in shadow;

c2. finding pels intermediate a pair of contacts;

c3. determining the slope of gray scale value change of said found pels to find one whose change of gray scale is a first value and is adjacent a second pel whose slope change of gray scale value is either zero or a second opposite-sign value to said first value;

c4. interpolating between said found pels to determine a position where said slope change of gray scale value is approximately zero and indicates a light minima; and c5. determining from said position, adjacent contact center positions of said imaged contact pattern.

7. The method as defined in claim 6 wherein subsequent to said step c5, the method further comprises the steps of:

c6. deriving from said determined contact center positions, a center and angular orientation of said imaged contact pattern.

8. The method as defined in claim 7 wherein subsequent to said step c6, the method further comprises the steps of:

c7. determining if either said center or angular orientation of said imaged contact pattern differs by more than predetermined limits, from said center or angular orientation of said contact pattern model, and if not;

c8. reorienting said contact pattern model by moving its center and angular orientations to match that of said imaged contact pattern.

9. The method as defined in claim 6, wherein each contact in said contact pattern is configured as a raised bump, and said illuminating step c1 is accomplished by directing a light beam parallel to the surface of said electronic device.

10. The method as defined in claim 9 wherein said step b further comprises the step of:

b1. convolving image pels of said electronic device by employing a site enhancement multi-pel kernel and sequencing said kernel through said image pels, multiplying values of said kernel pels by gray scale values of said image pels and accumulating products of said kernel pel multiplications for each said image pel.

11. The method as defined in claim 6 wherein step (c) further comprises the steps of:

c9. locating an approximate site of a pivot point in said imaged contact pattern;

c10. using a pivot point kernel, finding a pel in said imaged contact pattern corresponding to said pivot point;

c11. placing a chip angle kernel at said pivot point and determining an orientation angle of said imaged contact pattern using said kernel; and c12. orienting said contact pattern model coincident with said determined, imaged contact pattern pivot point and orientation angle.

12. The method as defined in claim 1 wherein step (e) further comprises:

e1. finding a maximum positional difference on each side of a lead frame;

e2. translating said bond site model to minimize said maximum positional differences; and e3. rotating said bond site model to further reduce said maximum positional differences.

13. The method as defined in claim 12 wherein step (e) further comprises:

e4. correcting for parallax errors resulting from offsets in leads in said lead frame by extracting a contribution to said error which grows in proportion to a lead's position in relation to an imaging camera.

14. The method as defined in claim 1 further comprising the steps of: g. averaging positional differences found in step (e) over N imaged lead frames and electronic devices; and h. adjusting the movement of said second movable support to minimize said averaged positional difference.

15. An apparatus for bonding contact areas of an electronic device to one of a plurality of lead frames, each said lead frame having a plurality of bond sites and first and second surfaces, said apparatus comprising;

advancing means for moving a lead frame into a bonding position, said advancing means being adjustably movable along a first axis but fixed along a second orthogonal axis;

support means for holding said electronic device so that its contact areas are disposed towards said first surface of said lead frame, said support means adjustably translatable both along said first and second axes and non-adjustably translatable along a third orthogonal axis which is perpendicular to said lead frame surfaces, said support means further adjustably rotatable about said third axis;

anvil means disposed along said third axis opposite said second surface of said lead frame, said anvil means fixed in said first axis, but adjustably translatable along said second and third axes;

optical means for imaging said advancing and support means;

processor means responsive to said optical means, for determining positional differences between bond sites on a lead frame and contact areas on an electronic device, and causing movements of said support means and advancing means on axes along which said means are respectively, adjustably translatable or rotatable, to reduce said positional differences, whereby reliable bonding is enabled to occur.

16. The apparatus as recited in claim 15, wherein said processor means, based upon positional errors determined between a bond site model and an imaged lead frame, controls said advancing means to alter its advancing action along said first axis to adjust the positioning of a group of succeeding lead frames.

17. The apparatus as recited in claim 16 wherein said processor means, alters the position of a bond site model to coincide with the position of an imaged lead frame.

18. The apparatus as recited in claim 17, wherein said processor means, in response to a comparison which indicates a fault between an imaged lead frame and said bond site model, causes any bonding action to be aborted and said advancing means to move another lead frame into said bonding position.

19. The apparatus as recited in claim 18, wherein said processor means, in response to positional errors determined between an imaged electronic device contact pattern and a model of said contact pattern, causes said model to alter its position by translating it along said first and second axes and rotating it about said third axis, all to reduce said positional errors to a minimum.

20. The apparatus recited in claim 19, further including transport means for moving electronic devices from a supply to said support means, said processor means, upon determining that positional errors between said imaged electronic device contact pattern and said contact pattern model exceed a threshold, causes said transport means to replace said electronic device with another.

21. The apparatus as recited in claim 20 wherein said processor means determines positional misalignments between said altered position bond site model and said model, and employs said positional error to reposition said advancing means and support means to compensate for said positional misalignments.

22. The apparatus as recited in claim 21 wherein said electronic device's bonding contact areas are raised bumps and wherein said optical means for imaging said support means illuminates said bumps with light beams which are parallel to a surface of said electronic device from which said bumps protrude.

* * * * *